(12) United States Patent
Alam et al.

(10) Patent No.: US 10,312,342 B2
(45) Date of Patent: Jun. 4, 2019

(54) NEMS DEVICES WITH SERIES FERROELECTRIC NEGATIVE CAPACITOR

(71) Applicant: Purdue Research Foundation, West Lafayette, IN (US)

(72) Inventors: Muhammad Ashraful Alam, West Lafayette, IN (US); Muhammad Masuduzzaman, West Lafayette, IN (US); Ankit Jain, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 15/695,440

(22) Filed: Sep. 5, 2017

(65) Prior Publication Data

US 2018/0012972 A1   Jan. 11, 2018

Related U.S. Application Data

(62) Division of application No. 14/701,502, filed on Apr. 30, 2015, now Pat. No. 9,755,041.

(Continued)

(51) Int. Cl.
| | |
|---|---|
| *G01L 9/00* | (2006.01) |
| *H01L 21/00* | (2006.01) |
| *H01L 29/51* | (2006.01) |
| *H01L 29/78* | (2006.01) |
| *H01L 27/11502* | (2017.01) |
| *H01L 27/11585* | (2017.01) |

(Continued)

(52) U.S. Cl.
CPC .............. *H01L 29/515* (2013.01); *B81B 7/02* (2013.01); *H01G 4/38* (2013.01); *H01G 5/16* (2013.01); *H01G 5/40* (2013.01); *H01G 7/06* (2013.01); *H01L 27/0805* (2013.01); *H01L 27/11502* (2013.01); *H01L 27/11585* (2013.01); *H01L 29/516* (2013.01); *H01L 29/7842* (2013.01); *B81B 2201/014* (2013.01); *B81B 2201/016* (2013.01); *B81B 2201/07* (2013.01)

(58) Field of Classification Search
CPC .................................................. H01L 27/11585
USPC .................. 438/50–53, 3; 257/415–419, 257
See application file for complete search history.

(56) References Cited

U.S. PATENT DOCUMENTS

| | | | | |
|---|---|---|---|---|
| 6,441,539 B1 * | 8/2002 | Kitamura | ................. | H03H 3/02 310/321 |
| 7,140,084 B2 * | 11/2006 | Yamada | ................. | B06B 1/0644 29/25.35 |
| 8,653,510 B2 * | 2/2014 | Hodges, Jr. | ......... | H01L 51/0529 257/175 |

FOREIGN PATENT DOCUMENTS

JP        2004-272171      * 3/2003   ........... G10K 11/178

* cited by examiner

*Primary Examiner* — Calvin Lee
(74) *Attorney, Agent, or Firm* — Purdue Research Foundation

(57) ABSTRACT

An electrical circuit comprising at least two negative capacitance insulators connected in series, one of the two negative capacitance insulators is biased to generate a negative capacitance. One of the negative capacitance insulators may include an air-gap which is part of a nanoelectromechnical system (NEMS) device and the second negative capacitance insulator includes a ferroelectric material. Both of the negative capacitance insulators may be located between the channel and gate of a field effect transistor. The NEMS device may include a movable electrode, a dielectric and a fixed electrode and arranged so that the movable electrode is attached to at least two points and spaced apart from the (Continued)

dielectric and fixed electrode, and the ferroelectric capacitor is electrically connected to either of the electrodes.

8 Claims, 38 Drawing Sheets

Related U.S. Application Data

(60) Provisional application No. 61/986,421, filed on Apr. 30, 2014.

(51) Int. Cl.
*B81B 7/02* (2006.01)
*H01G 4/38* (2006.01)
*H01L 27/08* (2006.01)
*H01G 5/16* (2006.01)
*H01G 5/40* (2006.01)
*H01G 7/06* (2006.01)

NEMS DEVICES WITH SERIES FERROELECTRIC NEGATIVE CAPACITOR

CROSS REFERENCE TO RELATED APPLICATIONS

The present U.S. patent application is a divisional of U.S. patent application Ser. No. 14/701,502, filed Apr. 30, 2015, now U.S. Pat. No. 9,755,041 issued Sep. 5, 2017, which claims the benefit of priority to U.S. provisional patent application 61/986,421, filed Apr. 30, 2014, the disclosures of which are hereby incorporated by reference.

TECHNICAL FIELD

The present application relates to microelectronic devices, and particularly to NEMS (nanoelectromechanical system) devices that are electrically connected in series with a ferroelectric negative capacitor, and also electrical circuits comprising a combination of at least two different negative capacitance gate insulators connected in series, such that the capacitance of the series combination is negative.

BACKGROUND

Nanoelectromechanical systems (NEMS) are seen as one of the most promising candidates for next generation extreme low power electronics that can operate as a versatile switch/memory/sensor/display element. The NEMS devices have often been mentioned as one of the most promising candidates in ITRS roadmap for a number of emerging device categories. The effective zero standby power dissipation and low subthreshold swing make it an ideal candidate for a logic switch (NEMFET), its intrinsic hysteresis suggests potential as a non-volatile memory element (NEMM), and its high quality factor and sensitivity to changes in mass/stiffness promise applications as RF resonators or nanobiosensors.

One of the main challenges toward this goal lies in the fabrication difficulties of ultra-scaled NEMS which is required for high density integrated circuits. It is believed that fabricating and operating a NEMS with an airgap below a few nanometers will be extremely challenging due to factors including surface roughness, non-ideal forces and tunneling. A Micro/Nano electromechanical system (M/NEMS) consists of a pair of electrodes one fixed and the other movable separated by an airgap. However, the most difficult challenge inhibiting the integration of these devices in next generation chips has been the reliable scalability of NEMS devices. For example, a low power memory/switch requires sub-1V actuation (Vpi), which can be achieved only if the airgap is scaled to a few nanometer range. Such an extreme scaling poses a difficult fabrication challenge. Moreover, the reduced airgap leads to the introduction of many non-ideal physical effects, such as the tunneling current (for less than 2 nm) which in turn degrades the subtreshold swing (SS) and standby power dissipation, the surface forces (for example, Van der Wall and Casimir) causing stiction, etc. Therefore, although NEMS switches with a 4 nm airgap (sub-1V Vpi) using a pipe-clip structure have been reported, the most advanced devices based on conventional geometry rely on an airgap of 15 nm (with a corresponding pull-in voltage, Vp13V).

Ferroelectric (FE) negative capacitors are known. Recently, Salahuddin and Datta has reported a ferroelectric negative capacitor connected in series with a classical gate oxide transistor in which the gate voltage was amplified and thereby reduced the sub-threshold swing below the 60 mV/decade limit. It is well-known that an FE capacitor is characterized by a negative capacitance around zero charge, but the capacitor by itself cannot be operated at this unstable point. Operation of an FE capacitor around this negative capacitance regime is possible only if the overall system is stabilized by adding a series capacitor. The stability comes from the fact that the charge state of the combined structure is determined by, not the FE alone, but the energetics of the overall structure. An elementary circuit analysis shows that, in the negative capacitance regime, the voltage across the FE capacitor can also be negative, even when a positive voltage is applied across the combined structure. Since the total applied voltage is constant, therefore, the voltage across the remaining series capacitor is higher than the applied voltage. Such voltage amplification is the basis of sub-60 mV/decade operation of the negative capacitance field effect transistor (NCFET) where the gate stack contains the FE film, and the remaining gate and the channel capacitance act as the series capacitor that stabilizes the FE film.

Another problem involves switches, which are the most basic component of integrated circuit (IC) technology. The sub-threshold swing (S) characterizes the switching characteristics of a switch where S=0 mV/decade corresponds to an ideal switch. However, current IC technology relies on field effect transistors (FETs) which are non-ideal in practice. The switching characteristics of a classical FET are far from being ideal and thermodynamics dictate that S cannot be lower than 60 mV/decade. Alternative approaches using devices with gate insulators with negative capacitance (NC) that have S<60 mV/decade such as Ferroelectric-FETs and suspended gate FETs have been developed. However, these approaches have not been able to achieve an ideal switching characteristic of S=0 mV/decade. Moreover, existing approaches of 0 mV/decade are not hysteresis-free. Therefore, improvements are needed in the field.

SUMMARY

According to one aspect of the present disclosure, an FE-NEMS cascade is provided, wherein the NEMS device acts as a stabilizing series capacitor. The NEMS device will experience a voltage amplification that results in lower applied voltage required to pull-in the NEMS. The FE-NEMS cascade, operating in the negative capacitance regime, further provides a number of additional and unexpected benefits for the operation of the NEMS device. Among the effects, the effective air-gap of the NEMS device is reduced by almost an order of magnitude, without the need to reduce the air-gap physically. Since this approach does not require physical reduction of the NEMS air-gap, it avoids the fabrication, reliability, and the non-ideality issues. This not only reduces the pull-in voltage to sub-1V ranges, but also offers a set of characteristics which are difficult or impossible to achieve otherwise. For example, this can improve the classical travel range, flip the traditional stable-unstable regime of the electrode, get a negative pull-out voltage, and thus, center the hysteresis around zero volt. Moreover, the combination can be operated as an effective ferroelectric memory with much reduced switching voltages. These characteristics promise dramatic saving in power for NEMS-based switching, memory, and other related applications.

For example, by combining a NEMS device in series with a FE capacitor, the physical travel range of the NEMS electrode is modified below or above the classical ⅓ range, and in principle, to any arbitrary limit. It is also possible to make the pull-out voltage negative, a feature extremely useful in memory applications which avoids the use of an extra charge layer to center the hysteresis at zero volt. In addition, in certain operating modes, the stable-unstable regime of the NEMS can be flipped so that the electrode operates in the lower part of the air-gap. This is useful in display/analog operations.

According to a second aspect, a switch is provided, comprising at least two different negative capacitance gate insulators connected in series within the same circuit to enable switching characteristics with S=0 mV/decade and hysteresis-free operation. This is achieved by choosing the two different NC gate insulators such that their NC regime overlap and their capacitance-charge characteristics are opposite to each other (for example, one increases while the other decreases). The combination of these individual elements which have opposing energy landscapes may at least partially cancel each other so that the combined structure has a total negative capacitance.

One suitable example of an NC gate insulator is an air-gap such as those found in suspended gate FETs. Another suitable example of an NC gate insulator is a ferroelectric material such as those found in ferroelectric FETs.

In the second aspect, the two different NC gate insulators are located within the same device. An example would be a FET with two different serially connected NC gate insulators located between the channel and gate of the FET. In this aspect, the two different NC gate insulators are chosen so the total capacitance of the FET gate insulator remains negative. In particular, the properties of the NC gate insulators are chosen such that (i) when one of the capacitance is infinite, other is negative and (ii) total capacitance should remain negative in the regime where one of the capacitance is positive and other negative. Therefore, series combination of properly designed NC gate insulators can make $C_{ins}(Q)$ negative by bypassing the point of infinite capacitance of individual NCs. This negative $C_{ins}(Q)$ can then be matched by $C_s(Q)$ through a proper design of the channel leading to ideal switching characteristics.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures.

FIG. 2B is an energy diagram illustrating the system energy as a function of charge at pull-in.

The attached drawings are for purposes of illustration and are not necessarily to scale.

DETAILED DESCRIPTION

Figure 1:
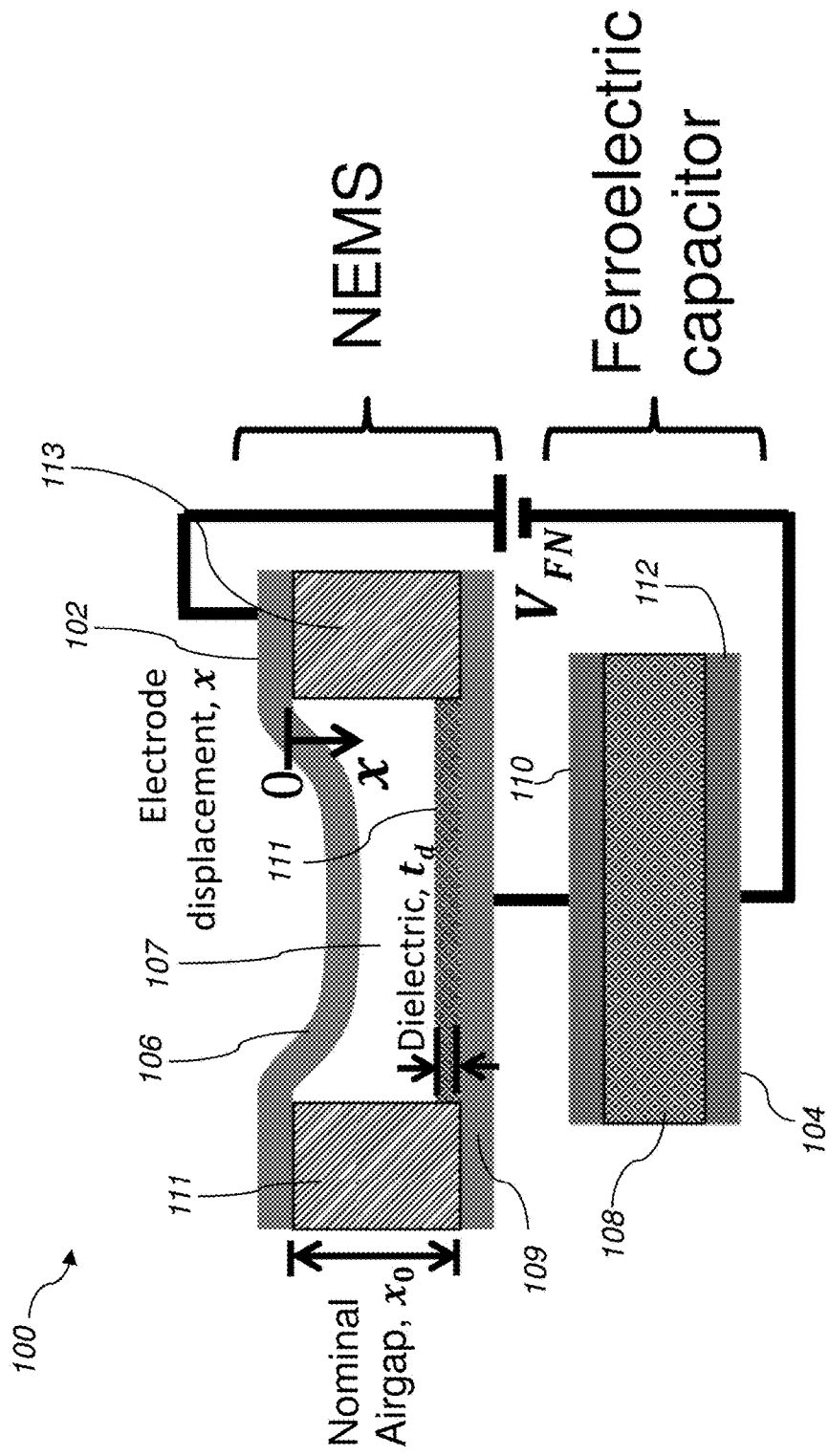
FIG. 1 is a cross-sectional schematic diagram of one embodiment of a parallel NEMS device connected in series with a FE negative capacitor.

As shown in FIG. 1A, a circuit 100 is provided comprising a NEMS capacitor 102 connected in series with a ferroelectric capacitor 104. The circuit 100 operates in the negative capacitance regime and is stabilized, and therefore effectively acts like a NEMS with a much smaller air-gap and reduced pull-in voltage. Such combination also offers tuning of the travel range by choosing ferroelectric of appropriate material and dimensions. In an effective NEMS mode, the pull-out voltage can be made negative and the hysteresis can be centered around zero volt. Such feature is not possible for even a scaled NEMS, and is extremely useful in operating the NEMS as a non-volatile memory or in passive NEMS-based displays. In the effective FE mode, the switching voltage of the ferroelectric capacitor is significantly reduced, and the NEMS can operate in the lower unstable region.

The NEMS capacitor 102 may further comprise a movable or flexible electrode 106 that is attached at two points and is separated from a fixed electrode 107 by an air gap 109 (the electrodes 106 and 109 held apart by pillars 111 and 113), with dielectric layer 111 placed on the fixed electrode 107 as shown. However, it is envisioned that the NEMS capacitor 102 can alternatively have a movable or flexible electrode that is attached only at one point or cantilevered. The movable or flexible electrode 106 may be clamped or pinned. The NEMS capacitors 102 can be fabricated by either a top-down (for example, optical and electron beam lithography) or a bottom-up approach (for example, molecular self-assembly and/or molecular recognition) as known in the field. Any suitable materials (for example, carbon based materials such as diamond, carbon nanotubes and grapheme) as known in the field may be used in the construction of the NEMS capacitor 102.

A ferroelectric capacitor, is a capacitor based on a ferroelectric material. As shown in FIG. 1A, ferroelectric capacitor 104 according to one embodiment comprises a ferroelectric material 108 sandwiched between two electrodes 110 and 112. Ferroelectric materials are a subgroup of pyroelectric materials in which the spontaneous polarization can be reoriented between "equilibrium" states by applying an electric field. Such materials are able to hold a positive or a negative electric charge, even with no additional voltage applied. Ferroelectrics can also switch polarity, from positive to negative, when an external electric field is applied. Examples of common ferroelectric materials are $PbTiO_3$, $Pb(Zr_{0.2}Ti_{0.8})O_3$ and $Sr_{0.8}Bi_{2.2}Ta_2O_9$. These undergo a ferroelectric phase transition characterized by the development of a spontaneous (zero field) polarization, changes in the dielectric constant, and crystal structural changes. Negative capacitance refers to the (usually) unstable charge-voltage relationship of a ferroelectric material that can be stabilized by combining the ferroelectric material with a capacitor in series. Suitable ferroelectric capacitors with negative capacitance may be fabricated as known in the art.

The ferroelectric capacitor 104 and a NEMS capacitor 102 have opposite energy characteristics which cancel each other when combined together. The resultant structure thus has low power dissipation. An electric circuit (such as circuit 100) comprising the NEMS capacitor 102 and ferroelectric negative capacitor 104 in series may be used for many different purposes and applications. Some non-limiting examples of application include logic switches, non-volatile memory, RF resonators and sensors (for example, nanobiosensors and AFM tips). Since this kind of electrical circuit has very low power dissipation, it is particularly useful in logical or computational devices and as memory for such devices. Another particularly useful application would be for circuitry and memory for display devices including those based on microcavity effects.

The Q-V Characteristics of a NEMS Capacitor:

To explain the operation of an FE-NEMS cascade such as circuit 100, the charge-voltage (Q-V) relationship for the NEMS capacitor 102 is first derived. When a charge Q is applied on NEMS capacitor 102, the movable electrode 106 experiences an electrostatic force $Q^2/(2\epsilon_0 A_N)$, and is displaced by some amount x (see FIG. 1). Here, $\epsilon_0$ is the permittivity of air and $A_N$ is the area of the electrode 106. Using the simple one-dimensional spring-mass model, the displacement is limited by the spring force $K_N x$, where $K_N$ is the spring constant of the electrode. At equilibrium, the net force on the movable electrode 106 of the NEMS 102 is zero, i.e., $$F_{net} = -K_N x + \frac{Q^2}{2\epsilon_0 A_N} = 0,$$

giving $$x = \frac{Q^2}{2K_N \epsilon_0 A_N}. \quad (1)$$

Eq. (1) defines the location of the electrode 106 ($x<x_0$) for any arbitrary charge Q, where $x_0$ is the nominal airgap. Now, the voltage across the NEMS capacitor 102 is $V_N=Q/C_N$, where $$C_N = \frac{\epsilon_0 A_N}{x_0 - x}.$$

Substituting the value of x from Eq. (1), and defining positive quantities $\alpha_N \equiv x_0/(\epsilon_0 A_N)$ and $$\beta_N \equiv \frac{1}{2K_N(\epsilon_0 A_N)^2},$$

we deduce the equation of the NEMS capacitor 102 as follows:

$$V_N = \alpha_N Q - \beta_N Q^3 \quad (2)$$

Figure 2A:
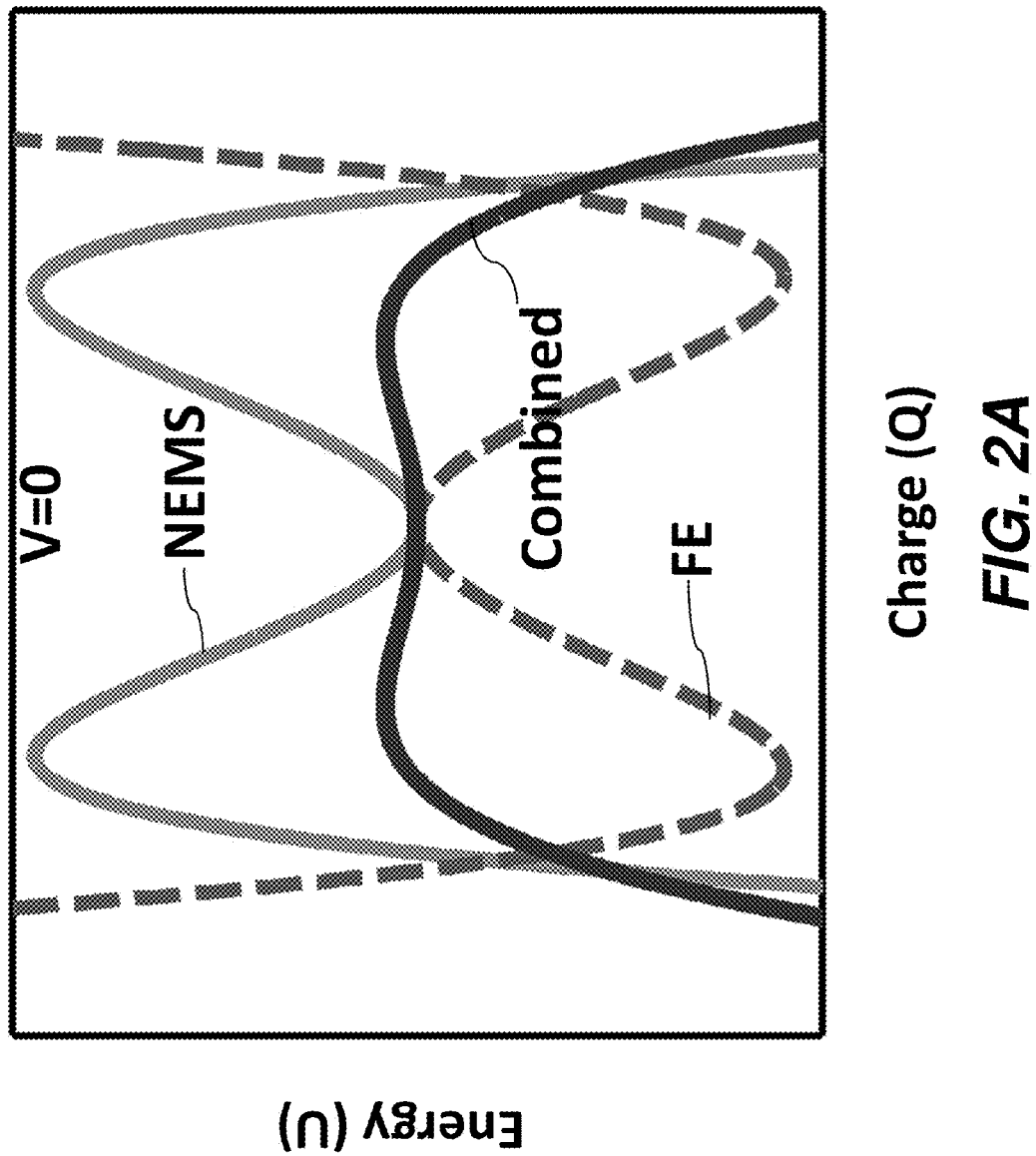
FIG. 2A is an energy diagram illustrating the system energy as a function of charge for V=0 in the NEMS device, the FE capacitor and the combined structure.

The state of the NEMS 102 at any instant is defined by the electrode charge, $Q(V_N)$ (FIG. 2a, gray line), as found from Eq. (2) for an applied bias, $V_N$. The electrode location corresponding to the charge (at stable or unstable equilibrium) can be found from Eq. (1), and is shown in FIG. 3B (thin line 302). The system energy is given by $$U_N = \left(\frac{1}{2}\right)\alpha_N Q^2 - \left(\frac{1}{4}\right)\beta_N Q^4 - V_N Q \quad (FIG. 2A,$$

NEMS) and the equilibrium solutions lie in the crest and valley locations $$\left(\frac{dU_N}{dQ} = 0\right).$$

Figure 3A:
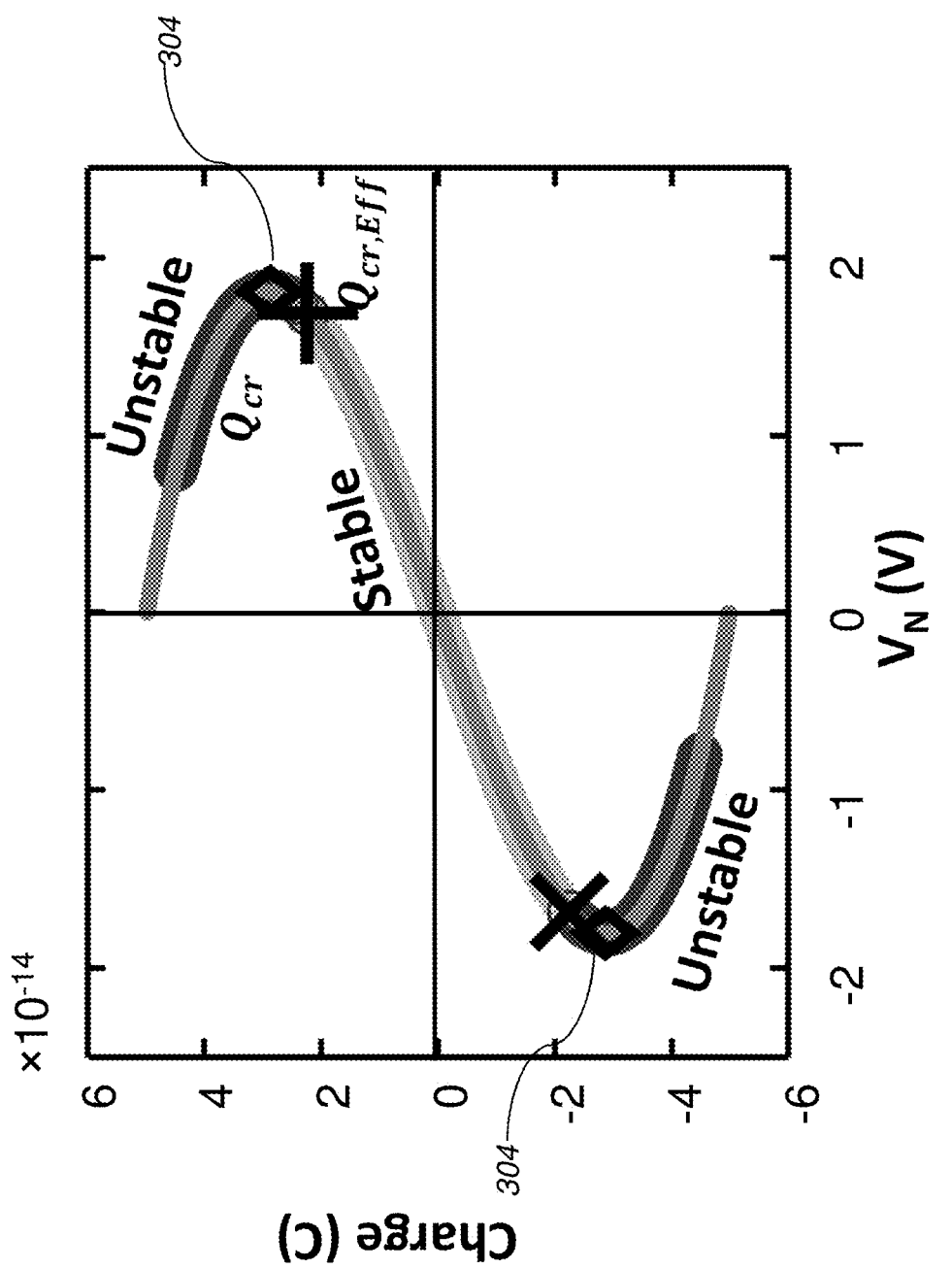
FIG. 3A is a plot which illustrates the Q-V characteristics for a NEMS device operating alone.
Figure 3B:
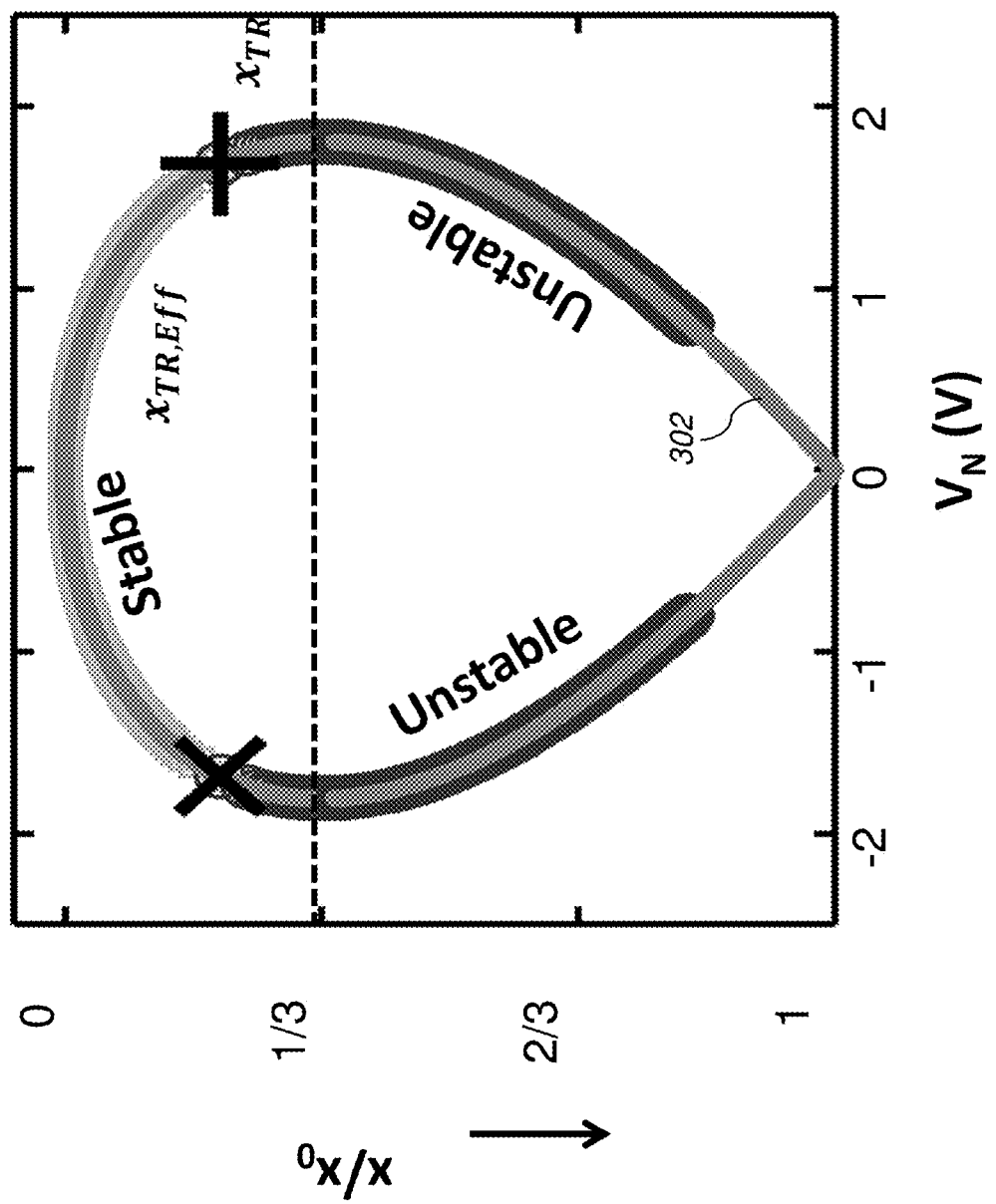
FIG. 3B is a plot which illustrates electrode displacement for a NEMS device operating alone.

The voltage at which the stable equilibrium solution (valley) disappears (with the critical charge, $$Q_{cr} = \sqrt{\frac{\alpha_N}{3\beta_N}}$$

as shown in FIG. 3A, (diamonds 304)) defines the pull-in voltage, and is given by $$V_{PI} = \frac{2\alpha_N}{3\sqrt{3}}\sqrt{\frac{\alpha_N}{\beta_N}}.$$

The corresponding electrode location defines the travel range, $x_{TR} = x_0/3$ (FIG. 3B), and can be obtained by inserting $Q_{cr}$ in Eq. (1).

The Q-V Characteristics of an FE Capacitor:

The electric field-polarization ($E_F$-P) characteristics of a ferroelectric capacitor can be expressed as: $E_F = \alpha'P + \beta'P^3 + \gamma'P^5 + \ldots$. Although additional terms may be necessary to characterize the double well energy landscape (FIG. 2A, FE) with greater accuracy, a two term approximation (with $\alpha'<0$, $\beta'>0$, and $\gamma'=0$) provides the simplest representation of the same, and is adopted here to demonstrate the concept analytically. The additional terms would not change the essence of the following argument. Since $E_F = V_F/t_1$, where $t_1$ is the thickness of the dielectric 111, and the charge across the ferroelectric capacitor is given by, $Q = P \cdot A_F$, where $A_F$ is the area of the FE capacitor, the Q-V relationship (FIG. 3C) for the ferroelectric capacitor can be deduced as:

$$V_F = \alpha_F Q + \beta_F Q^3, \quad (3)$$

where the coefficients $\alpha_F \equiv -\alpha't_1/A_F$ and $\beta_F \equiv \beta't_1/A_F^3$ are both positive quantities.

Note that, for the ferroelectric capacitor, the first term is negative (compare, a simple capacitor, $V=+(1/C)Q$, a reason why a ferroelectric capacitor is sometimes referred as a negative capacitor for charge magnitude close to zero. Also note that both Eqs. (2) and (3) have the same form except that the signs of the coefficients are opposite, which is also reflected in the inverted energy landscape $$\left(U_F = -\left(\frac{1}{2}\right)\alpha_F Q^2 + \left(\frac{1}{4}\right)\beta_F Q^4 - V_F Q\right)$$

and the two stable minima of the ferroelectric capacitor (FIG. 2A), as compared to a single minima for a NEMS capacitor.

The Q-V Characteristics of an FE-NEMS Cascade:

When the two capacitors are connected in series, the net voltage ($V_{FN}$) can be found by adding Eqs. (2) and (3) as—

$$V_{FN} = (\alpha_N - \alpha_F)Q - (\beta_N - \beta_F)Q^3 = \alpha_N^{Eff}Q - \beta_N^{Eff}Q^3 = r_{\alpha_N}\alpha_N Q - r_{\beta_N}\beta_N Q^3 \quad (4)$$

where the factors $$r_{\alpha_N} \equiv \frac{\alpha_N^{Eff}}{\alpha_N} = 1 - \left(\frac{t_1}{x_0}\right)\left(\frac{A_N}{A_F}\right)(|\alpha'|\epsilon_0) \text{ and}$$

$$r_{\beta_N} \equiv \frac{\beta_N^{Eff}}{\beta_N} = 1 - (2\beta'K_N\epsilon_0^2)\left(\frac{t_1 A_N^2}{A_F^3}\right)$$

depends on the dimensions and the material parameters of both the FE and the NEMS capacitors. Such an FE-NEMS combination reduces of the effective charge coefficients (e.g., $\alpha_N^{Eff} = \alpha_N - \alpha_F$, in Eq. (4)) and correspondingly, flattens the energy landscape (FIG. 2A) of the combined system. This flattening of the overall energy landscape defines the essential innovation of the work, which, owing to the opposing characteristics of the FE and the NEMS energy landscapes (FIG. 2A), is valid regardless of the complexity of the models used to represent the FE or the NEMS capacitor (e.g., Euler-Bernoulli equations instead of 1D spring mass model for NEMS). A series combination of similar capacitors (e.g., two classical, ferroelectrics, or NEMS capacitors) cannot achieve such a cancellation of charge coefficients. Now, depending on the sign of the difference of the charge coefficients ($\alpha_N^{Eff}$ and $\beta_N^{Eff}$), the effective structure could have a NEMS or an FE characteristics.

Effective NEMS Mode:

According to one aspect, the FE-NEMS cascade is operated in an effective NEMS mode (compare Eq. (4) and (2)) by ensuring that both $\alpha_N^{Eff}$ and $\beta_N^{Eff}$ are positive (or, $0<(r_{\alpha_N}, r_{\beta_N})<1$). Due to the change in the charge coefficients, the critical charge for pull-in for the effective structure has changed to (see FIG. 2d, '+' and '×')

$$Q_{cr,Eff} = \sqrt{\frac{\alpha_N^{Eff}}{3\beta_N^{Eff}}} = \sqrt{\frac{r_{\alpha_N}}{r_{\beta_N}}} Q_{cr}.$$

Figure 2C:
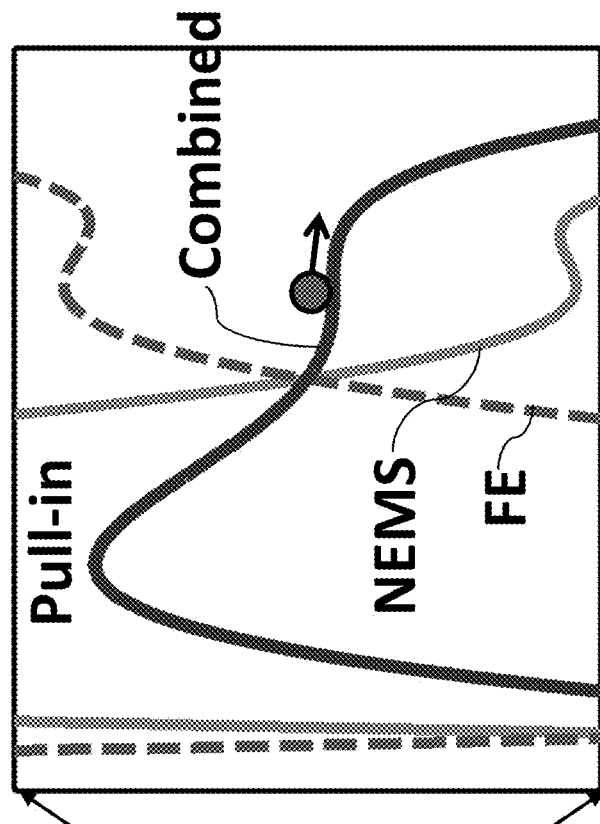
FIG. 2C is an enlargement of a central portion of the diagram of FIG. 2B.
Figure 2B:
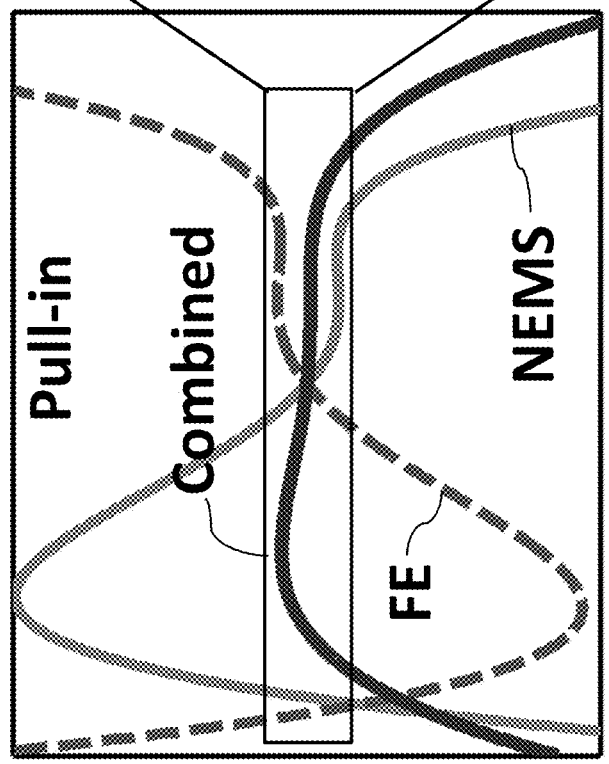

Using $Q_{cr,Eff}$ in Eq. (1), the travel range is found as:

$$x_{TR,Eff} = \left(\frac{r_{\alpha_N}}{r_{\beta_N}}\right)\left(\frac{1}{3}\right)x_0, \quad (5)$$

which is different from the classical ⅓ range. To understand physically why the travel range changes, FIG. 2B (magnified in FIG. 2C) shows the individual ($U_N$ and $U_F$) as well as the combined energy landscapes ($U=U_N+U_F$) of the FE-NEMS combination at the pull-in voltage. Note that although the NEMS itself is 'not ready' to pull-in (FIG. 2C), the energy landscape of the ferroelectric is such that the overall energy of the system warrants pull-in condition. The new effective pull-in voltage ($V_{PI,Eff}$) of the series structure compares with the original $V_{PI}$ of the NEMS as:

$$V_{PI,Eff} = \frac{2\alpha_N^{Eff}}{3\sqrt{3}} \sqrt{\frac{\alpha_N^{Eff}}{\beta_N^{Eff}}} = \left(r_{\alpha_N}\sqrt{\frac{r_{\alpha_N}}{r_{\beta_N}}}\right)V_{PI}. \quad (6)$$

Note that, if one would start with a single NEMS with scaled parameters $x_{Eff}$ and $K_{Eff}$, where $$x_{Eff}=r_{\alpha_N}x_0 \text{ and } K_{Eff}=K_N/r_{\beta_N}, \quad (7)$$

one would achieve the same Q-V relationship as the FE-NEMS cascade (Eq. (4)), and would get a pull-in voltage as, $$V_{PI,Scaled} = \sqrt{\frac{8(K_N/r_{\beta_N})(r_{\alpha_N}x_0)^3}{27\epsilon_0 A_N}},$$

which is same as Eq. (6). Thus, the series structure effectively reduces the airgap of the NEMS as in Eq. (7), as long as pull-in is concerned.

For a quantitative example, consider a NEMS having a TiN cantilever, with Young's modulus=450 GPa, width/length/thickness=3/6/0.5 μm, and an airgap $x_0$=15 nm. The ferroelectric capacitor is SBT ($Sr_{0.8}Bi_{2.2}Ta_2O_9$) ($\alpha'$=−6.5e7 m/F, $\beta'$=3.75e9 m$^5$F/coul$^2$ and $\gamma'$=0, at room temperature) with $t_1$=500 nm and $A_F$=0.4 μm$^2$. Such FE-NEMS combination gives $r_{\alpha_N}$=0.137, $r_{\beta_N}$=0.225. This reduces the effective airgap from 15 nm to 2 nm, the pull-in voltage from 1.8V to 0.19V (a factor of 9.4) and the travel range from 5 nm to 3 nm.

Figure 3C:
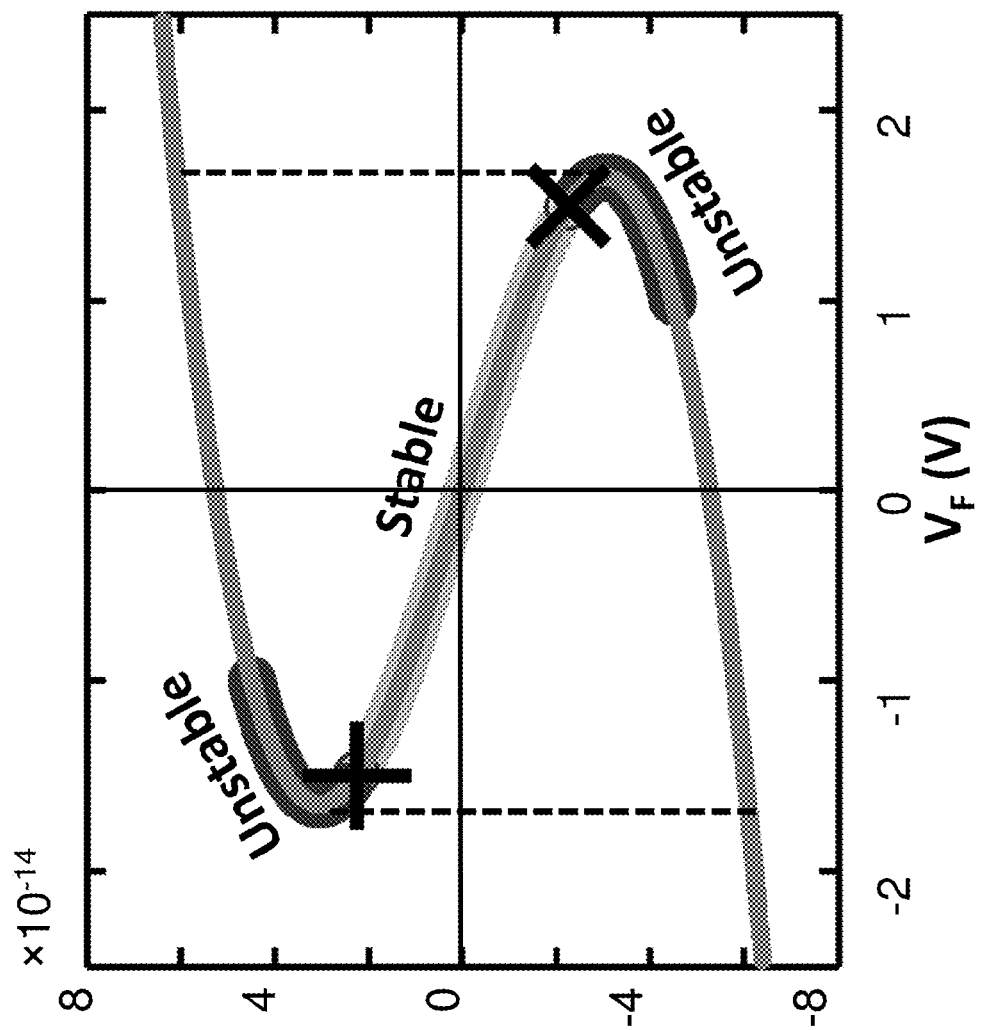
FIG. 3C is a plot which illustrates the Q-V characteristics of a ferroelectric operating alone.
Figure 3D:
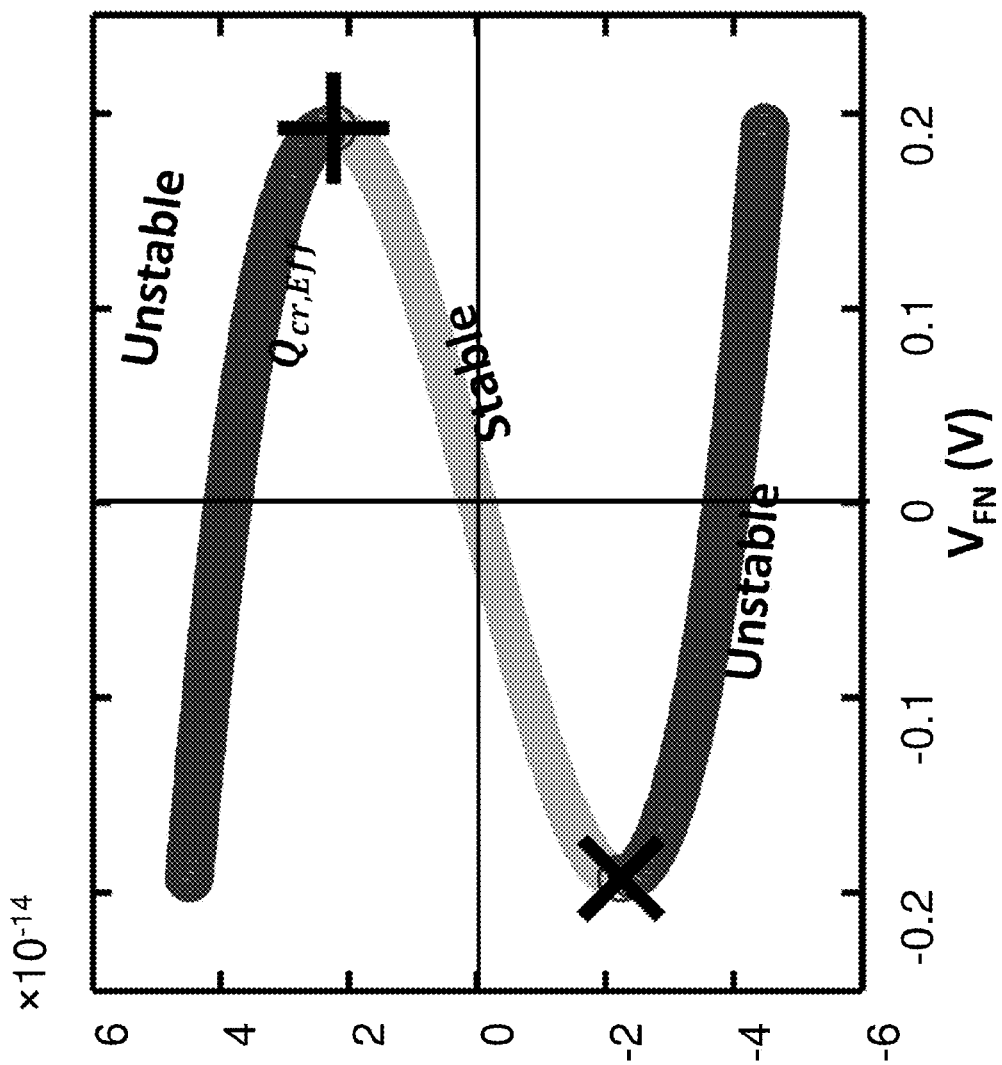
FIG. 3D is a plot which illustrates the Q-V characteristics of a combined NEMS-FE structure operating in an effective NEMS mode according to one embodiment.

The dramatic reduction in the effective pull-in voltage $V_{PI,Eff}$ by about an order of magnitude can be traced to two factors: (i) the reduced $Q_{cr,Eff}$ (or travel range), and (ii) the voltage amplification. This can be understood from FIG. 3E which shows the component voltages ($V_F$ and $V_N$) as a function of the total applied voltage, $V_{FN}$. The applied bias (positive) where the pull-in occurs is denoted by the symbol '+'. Note that although $V_{FN}$ is positive, the voltage across the FE ($V_F$) is negative. This results in an amplification of the applied voltage across the NEMS (i.e., $V_N=V_{FN}-V_F=V_{FN}+|V_F|$). Thus, pull-in at much lower applied voltage has been possible. Finally, combining FIGS. 3D and 3E, the equilibrium charge states in the series configuration have been mapped in FIGS. 3A-C (stable) and (unstable) regions, separated by '+' or '×'), showing the operating regimes of the NEMS 102 and the FE 104. Note that, in the stable equilibrium conditions of the series configuration, the FE capacitor 104 operates in the unstable negative capacitance regime $$\left(\frac{dQ}{dV_F} < 0\right),$$

however, the NEMS capacitor 102 operates in the stable positive capacitance regime $$\left(\frac{dQ}{dV_N} > 0\right),$$

see stable regions of FIGS. 3C and 3A, respectively. The modified critical charge and the travel range are also evident from FIG. 3A-B (symbol '+'), respectively.

Figure 4A:
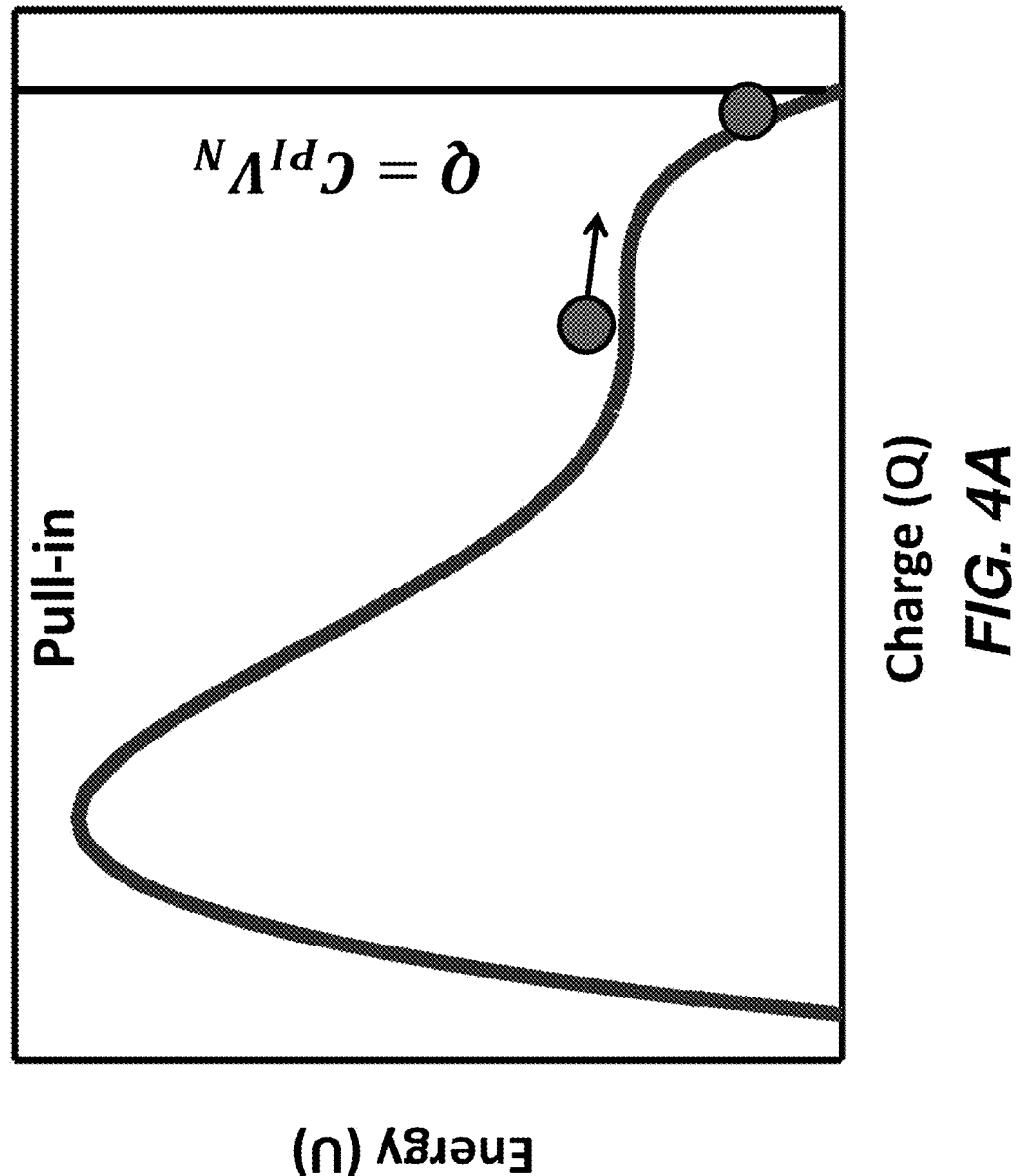
FIG. 4A is an energy diagram illustrating the system energy as a function of charge for a FE-NEMS system according to one embodiment after a pull-in condition.

Pull-Out:

After pull-in (and as long as it remains in the pulled-in state), see FIG. 4A, the charge of any NEMS capacitor is determined by the thickness of the dielectric layer 111 on the bottom electrode $t_d$, or equivalently, the pull-in capacitance $$\left(C_{PI} = \frac{\epsilon_0 A_N}{t_d/\epsilon_r} \equiv 1/\alpha_{PI},\right.$$

where $\epsilon_r$ is the relative permittivity of the dielectric layer) as:

$$V_N=\alpha_{PI}Q. \quad (8)$$

Figure 4B:
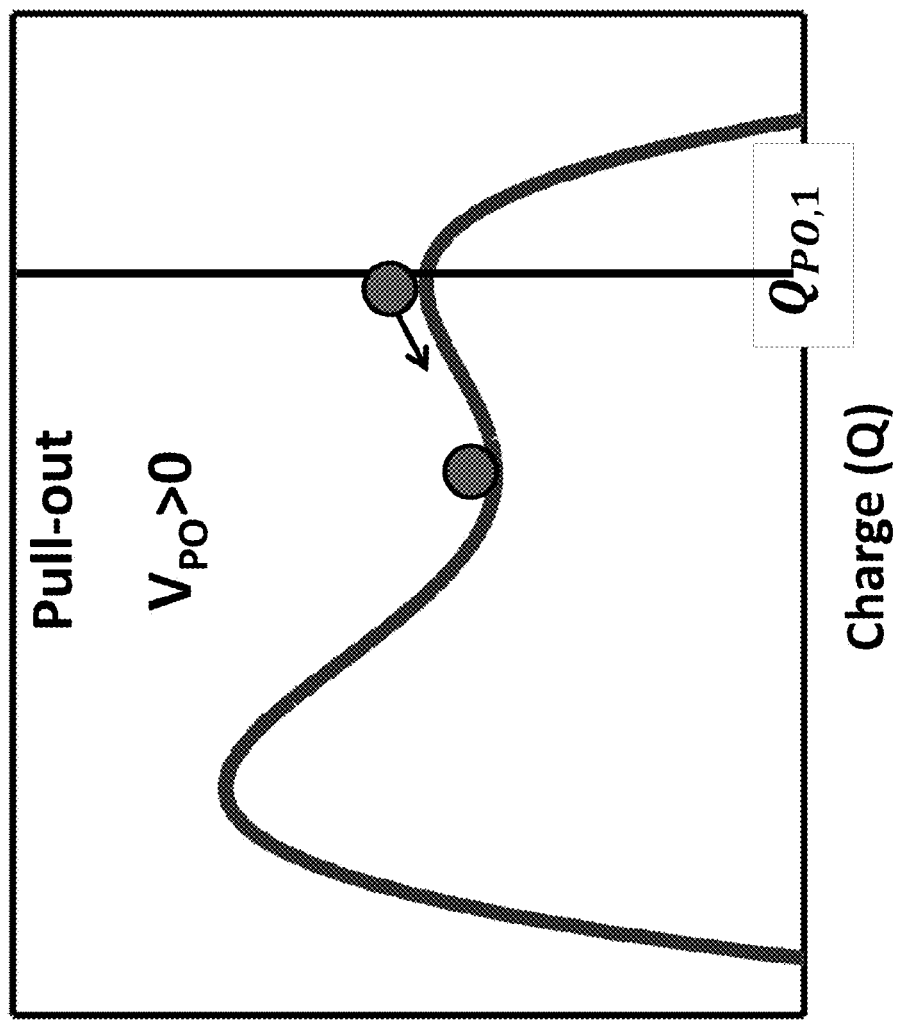
FIG. 4B is an energy diagram illustrating the system energy as a function of charge for a FE-NEMS system according to one embodiment during a first pull-out condition.

At the point of pull-out, the charge reaches an unstable equilibrium ($Q_{PO}$, see FIG. 4B) and the pull-out voltage (see supplementary information) is a subset of the solutions of Eqs. (8) and (4), as:

$$V_{PO,Eff} = r_V(V_{PO,Eff})\sqrt{\frac{(\alpha_N^{Eff} - r_V(V_{PO,Eff})\alpha_{PI})\alpha_{PI}^2}{\beta_N^{Eff}}}. \quad (9)$$

Figure 3E:
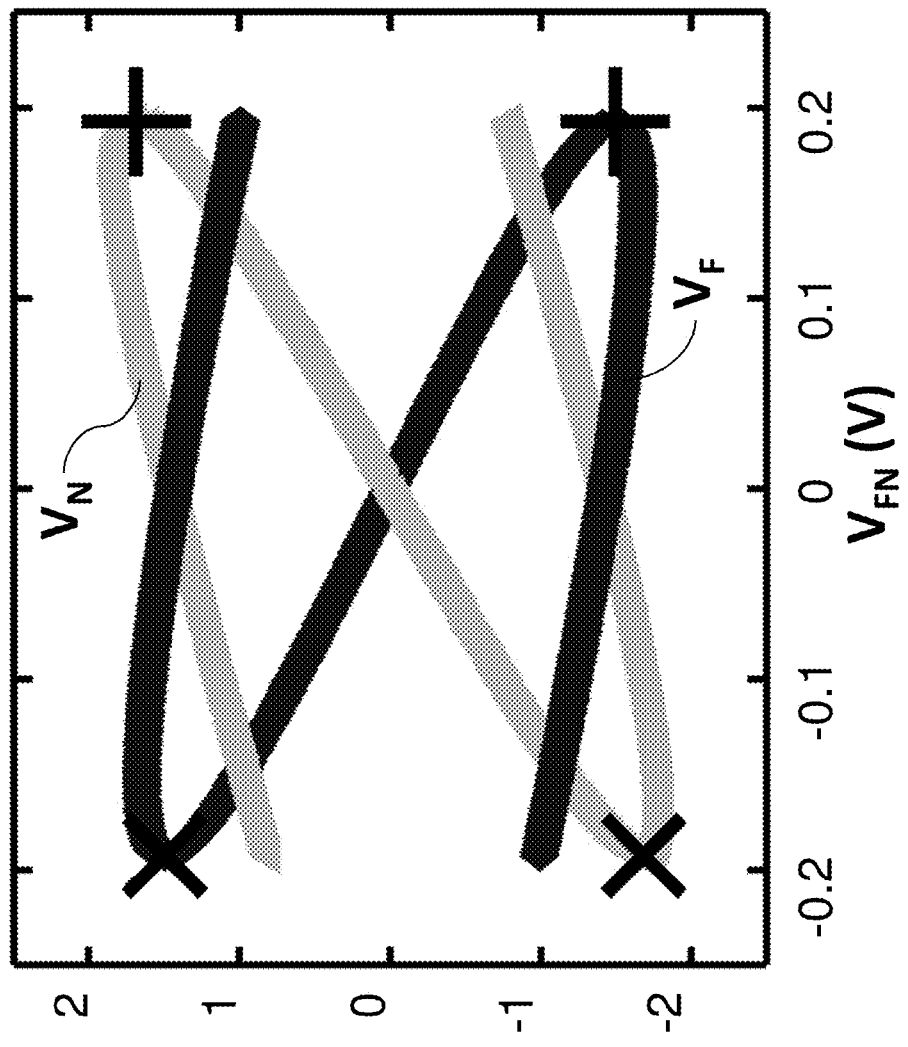
FIG. 3E is a plot which illustrates the component voltages of a combined NEMS-FE structure operating in an effective NEMS mode according to one embodiment.

For the FE-NEMS cascade, however, Eq. (9) is an implicit expression, containing the voltage ratio $r_V(V_{FN})\equiv V_{FN}/V_N$, and must be solved numerically (FIG. 3E). In the absence of the FE capacitor, $r_{\alpha_N}=r_{\beta_N}=r_V=1$, and Eq. (9) reduces to the classical formula:

$$V_{PO} = \sqrt{\frac{2K_N(x_0 - t_d/\epsilon_r)(t_d/\epsilon_r)^2}{\epsilon_0 A_N}}$$

for any given dielectric material and thickness ($t_d/\epsilon_r$).

Conversely, the required dielectric thickness (or $C_{PI}$) can be found for any desirable $V_{PO}$. For that, the pull-out charge ($Q_{PO}$) for that $V_{PO}$ (see FIGS. 4B and 4D) is first found, then the corresponding electrode displacement $x_{PO}$ from Eq. (1), and finally, the required capacitance as $$C_{PI} = \frac{\epsilon_r\epsilon_0 A_N}{x_0 - x_{PO}} \leq \infty.$$

Figure 4C:
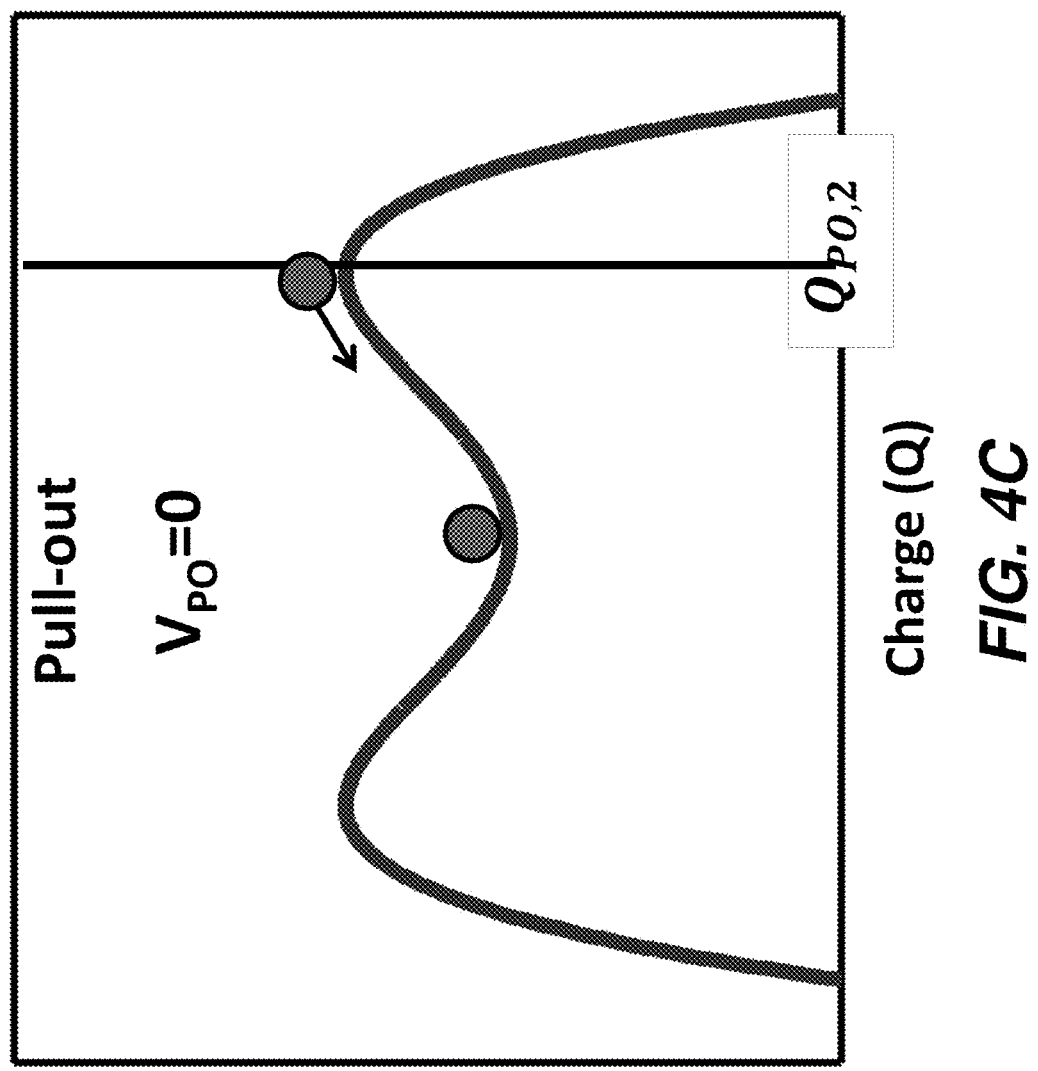
FIG. 4C is an energy diagram illustrating the system energy as a function of charge for a FE-NEMS system according to one embodiment during a second pull-out condition.

For example, for $V_{PO}$=0 (FIG. 4C), one can find $$Q_{PO} = \sqrt{\frac{\alpha_N^{Eff}}{\beta_N^{Eff}}}, x_{PO} = \left(\frac{r_{\alpha_N}}{r_{\beta_N}}\right)x_0,$$

and $$C_{PI}(V_{PO}=0V) = \frac{\epsilon_r \epsilon_0 A_N}{x_0 - \left(\frac{r_{\alpha_N}}{r_{\beta_N}}\right) x_0}.$$

Figure 4D:
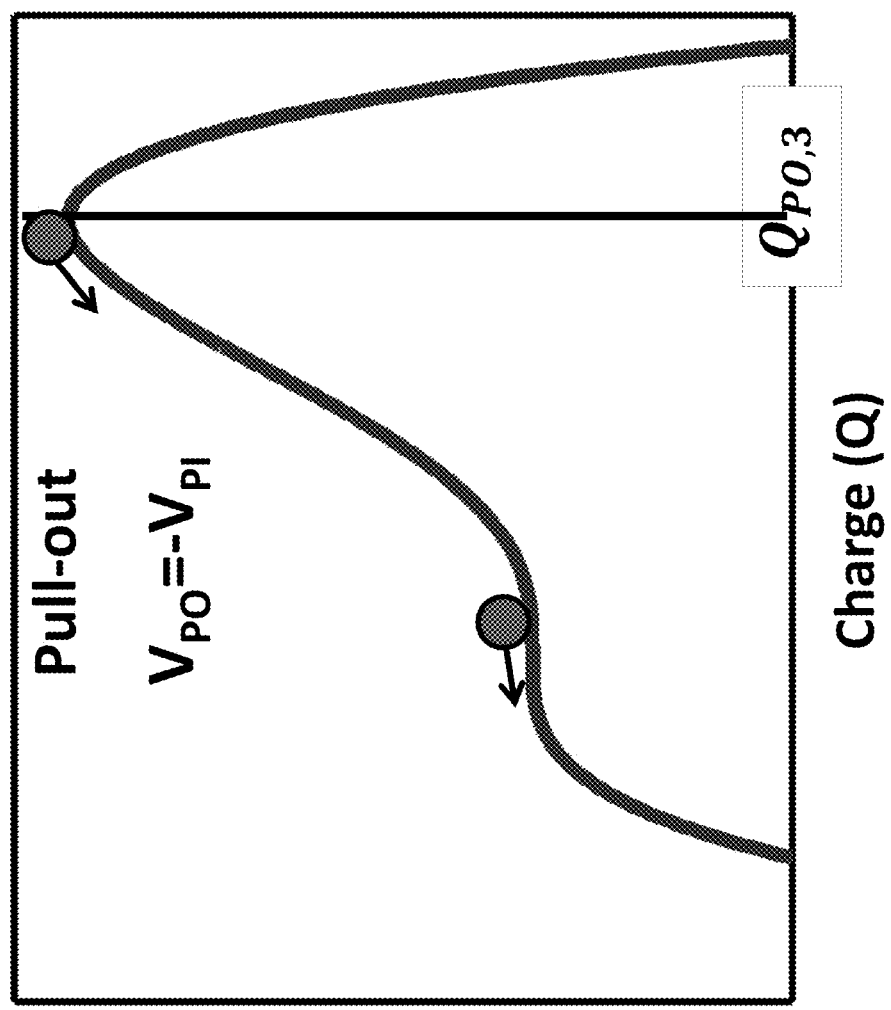
FIG. 4D is an energy diagram illustrating the system energy as a function of charge for a FE-NEMS system according to one embodiment during a third pull-out condition.

For a single NEMS, since $r_{\alpha_N}=r_{\beta_N}=1$, thus $C_{PI}(V_{PO}=0V)=\infty$, or equivalently, the required dielectric thickness ($t_d$) is zero—a well-known result. Since, $C_{PI}=\infty$ is the maximum possible capacitance, $V_{PO}$ cannot be negative for an isolated NEMS. However, for the FE-NEMS circuit 100, since $(r_{\alpha_N}, r_{\beta_N})<1$, one may have negative $V_{PO}$ as long as $C_{PI}\leq\infty$. For example, for $V_{PO}=-V_{PI}$ (FIG. 4D), one finds that $$Q_{PO} = 2\sqrt{\frac{\alpha_N^{Eff}}{3\beta_N^{Eff}}}, \quad x_{PO} = \left(\frac{4}{3}\right)\left(\frac{r_{\alpha_N}}{r_{\beta_N}}\right)x_0,$$

and $C_{PI}(V_{PO}=-V_{PI}) = \frac{\epsilon_r \epsilon_0 A_N}{x_0 - \left(\frac{4}{3}\right)\left(\frac{r_{\alpha_N}}{r_{\beta_N}}\right)x_0}.$ With $\frac{r_{\alpha_N}}{r_{\beta_N}} < \frac{3}{4}$, $C_{PI}$ is positive and finite, and thus, negative $V_{PO}$ is possible. However, it should be noted that a $V_{PO}\leq-V_{PI}$ is not desirable, as the NEMS will be pulled-in again with reversed charge (FIG. 4D). To avoid this condition, the maximum pull-in capacitance is $C_{PI}(V_{PO}=-V_{PI})\leq\infty$, or equivalently, the minimum dielectric thickness is $$t_{d,min} = \left(x_0 - \left(\frac{4}{3}\right)\left(\frac{r_{\alpha_N}}{r_{\beta_N}}\right)x_0\right) \geq 0.$$

Note that, in addition to the reduction of $V_{PI}$, the capability of designing a NEMS with a negative $V_{PO}$ is another advantage of the FE-NEMS cascade 100.

As one non-limiting example, a stable-unstable cascading is illustrated. This will demonstrate that using the same FE-NEMS circuit 100, a stable effective ferroelectric capacitor may be achieved, as described in the following (see FIG. 3F-J):

Effective FE Mode:

In Eq. (4), both $\alpha_N^{Eff}$ and $\beta_N^{Eff}$ (or $r_{\alpha_N}$ and $r_{\beta_N}$) can be made negative with appropriate choice of parameters. If we define positive quantities $\alpha_F^{Eff}\equiv-\alpha_N^{Eff}$, $\beta_F^{Eff}\equiv-\beta_N^{Eff}$, $r_{\alpha_F}\equiv\alpha_F^{Eff}/\alpha_F=-r_{\alpha_N}/(1-r_{\alpha_N})$ and $r_{\beta_F}\equiv\beta_F^{Eff}/\beta_F=-r_{\beta_N}/(1-r_{\beta_N})$, where $0<(r_{\alpha_F}, r_{\beta_F})<1$, then Eq. (4) can be written as, $$V_{FN}=-(\alpha_F-\alpha_N)Q+(\beta_F-\beta_N)Q^3=-\alpha_F^{Eff}Q+\beta_F^{Eff}Q^3=-r_{\alpha_F}\alpha_F Q+r_{\beta_F}\beta_F Q^3. \quad (10)$$

This represents an effective FE mode (compare Eq. (10) with Eq. (3)), where the Q-V is similar to a ferroelectric capacitor (note the difference between FIG. 3I and FIG. 3D).

Figure 3F:
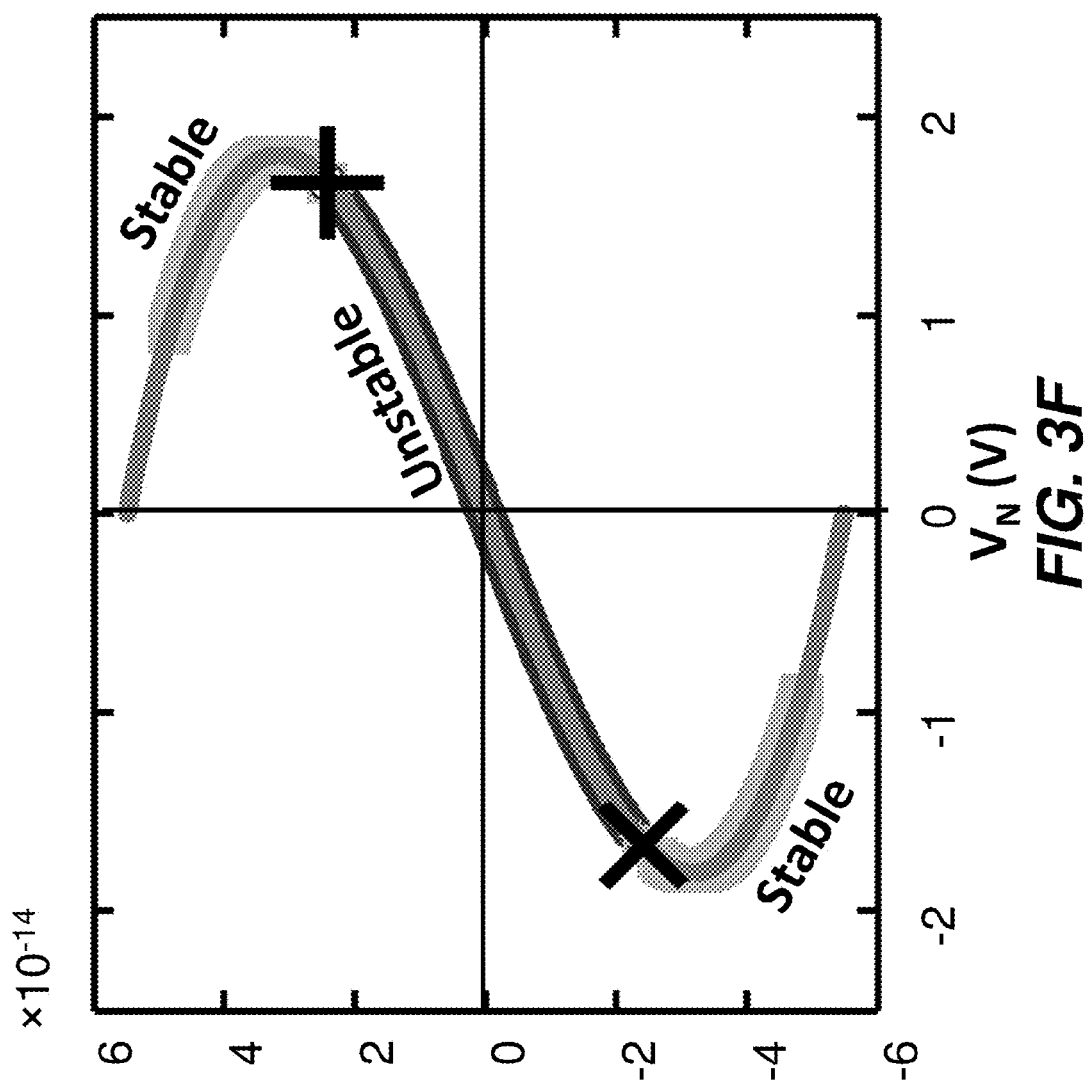
FIG. 3F is a plot which illustrates the Q-V characteristics for a NEMS device operating alone.
Figure 3G:
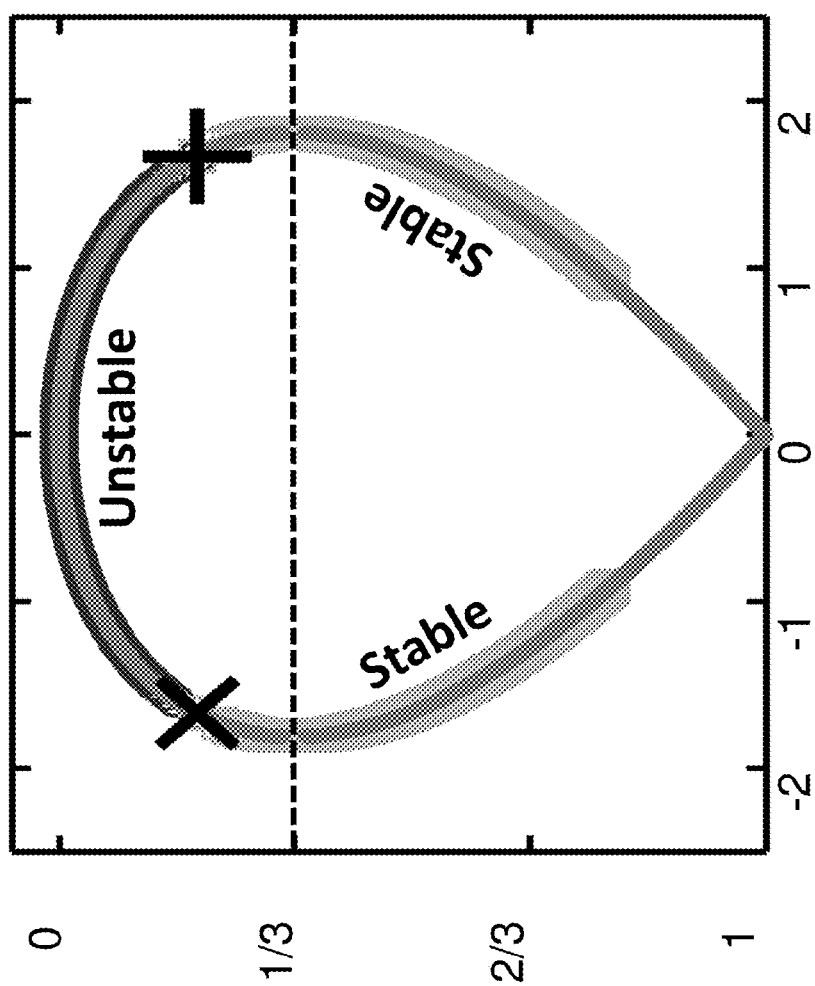
FIG. 3G is a plot which illustrates electrode displacement for a NEMS device operating alone.
Figure 3H:
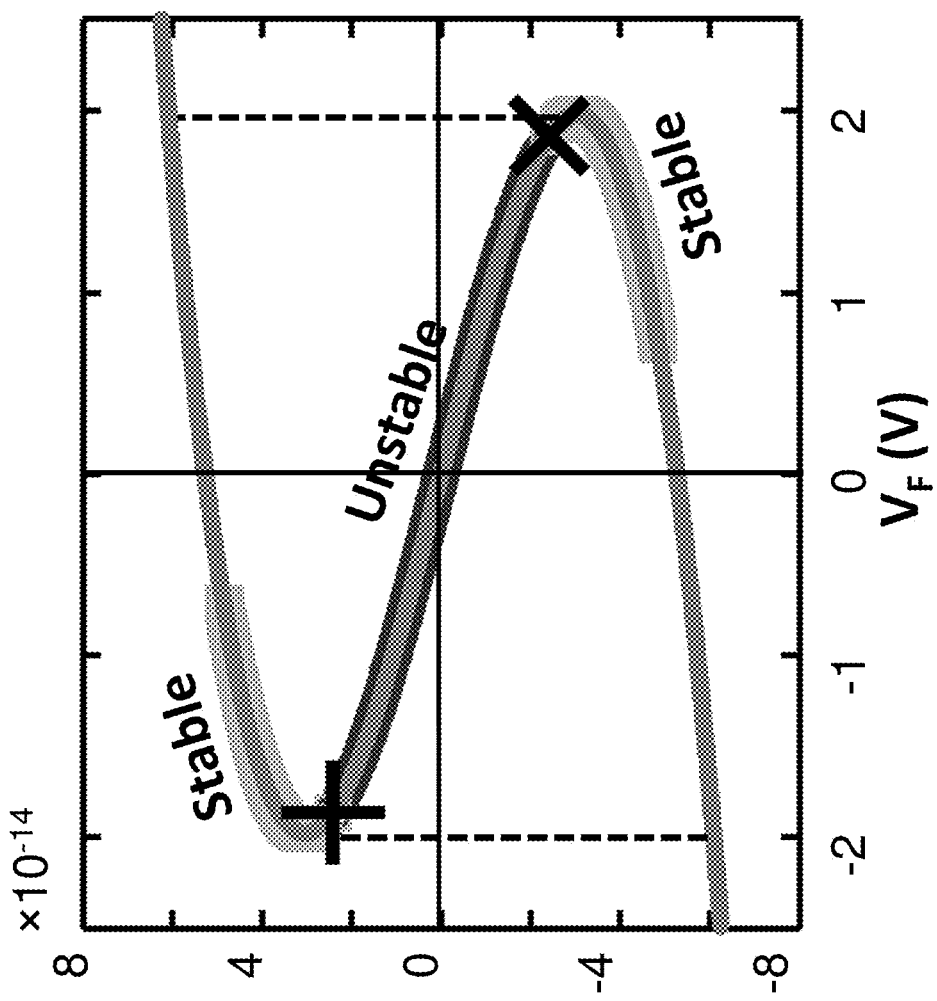
FIG. 3H is a plot which illustrates the Q-V characteristics of a ferroelectric operating alone.
Figure 3I:
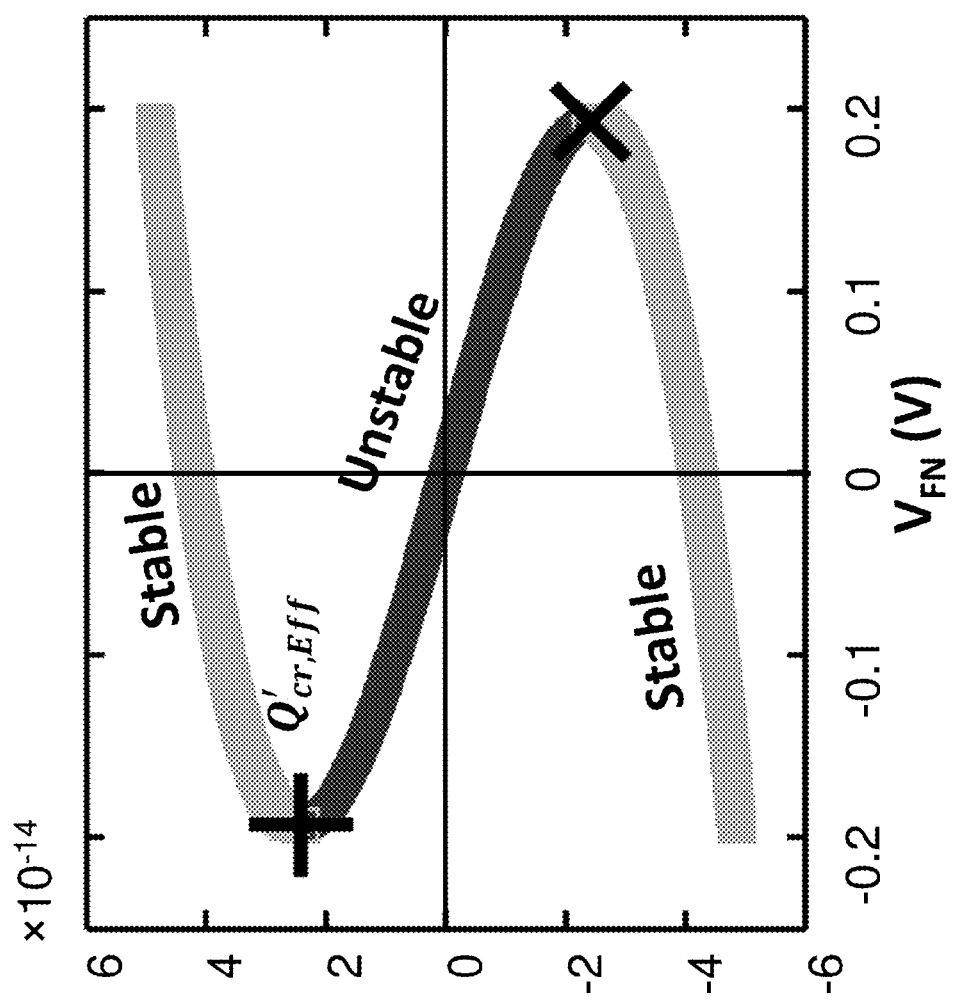
FIG. 3I is a plot which illustrates the Q-V characteristics of a combined NEMS-FE structure operating in an effective ferroelectric mode according to one embodiment.
Figure 3J:
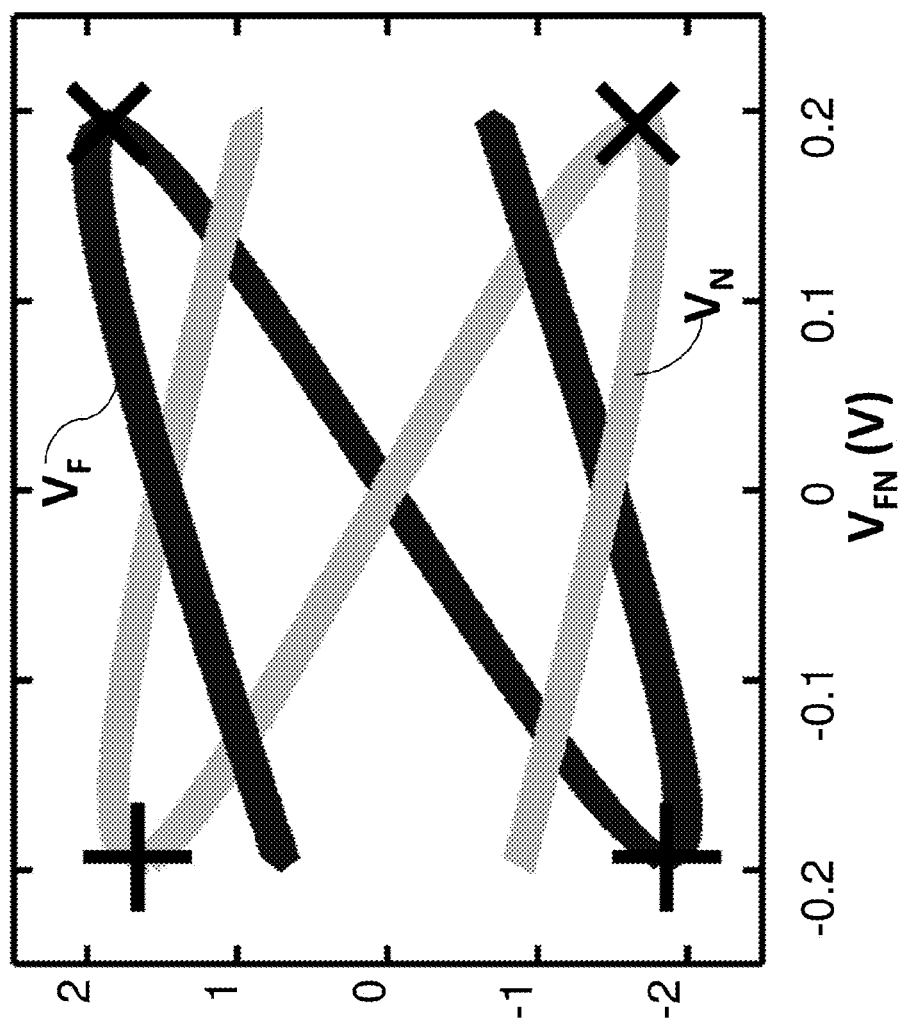
FIG. 3J is a plot which illustrates the component voltages of a combined NEMS-FE structure operating in an effective ferroelectric mode according to one embodiment.

As before, the voltages across the two components are shown in FIG. 3J and the equilibrium charge states and electrode locations are mapped in FIG. 3F-H to show the operating regimes of the NEMS and the ferroelectric capacitor in the FE-NEMS circuit 100. The switching (coercive) voltage of the effective FE($V_{C,Eff}$) is modified from that of the single FE($V_C$) as:

$$V_{C,Eff} = \frac{2\alpha_F^{Eff}}{3\sqrt{3}}\sqrt{\frac{\alpha_F^{Eff}}{\beta_F^{Eff}}} = \left(r_{\alpha_F}\sqrt{\frac{r_{\alpha_F}}{r_{\beta_F}}}\right)V_C \quad (11)$$

Note that $V_{C,Eff}$ could be reduced by choosing appropriate values of $r_{\alpha_F}$ and $r_{\beta_F}$. For example, in the previous example, if the NEMS cantilever has width/length/thickness=3.3/6/0.5 µm, the ferroelectric capacitor has a thickness of 600 nm, and everything else remains the same, then the FE-NEMS circuit 100 operates in the effective FE mode with $r_{\alpha_F}=0.122$ and $r_{\beta_F}=0.192$, which reduces the coercive voltage to 9.8% of the original value ($V_C$). However, a further advantage is that the NEMS can now be stabilized at the lower portion of the airgap with the upper portion being unstable (FIG. 3G, green and red regions, respectively) which is in contrary to any traditional NEMS (FIG. 3B). The flipping of the stable-unstable region occurs because, in an effective FE mode, the overall system is unstable around zero charge and stable at a higher charge (FIG. 3I). This is opposite to that for a traditional NEMS (compare with FIG. 3D).

The above-described aspect therefore provides a NEMS capacitor 102 connected in series with a ferroelectric capacitor 104 operating in the negative capacitance regime which can be stabilized, and effectively, acts like a NEMS with a much smaller airgap and reduced pull-in voltage. Such combination also offers tuning of the travel range by choosing ferroelectric of appropriate material and dimensions. With this effective NEMS mode, the pull-out voltage can be made negative and the hysteresis can be centered around zero volt. Such feature is not possible for even a physically scaled NEMS, and is extremely useful in operating the NEMS as a non-volatile memory or in passive NEMS-based displays. In the effective FE mode, the switching voltage of the ferroelectric capacitor is significantly reduced, and the NEMS can operate in the lower unstable region.

According to another embodiment, a FET is provided which comprises two different serially connected NC gate insulators with opposite energy characteristics which cancel each other when combined together. The resultant structure thus can provide ideal or near-ideal abrupt switching characteristic and be hysteresis-free. An electric circuit comprising this type of FET can be used for many different purposes and application. In addition to those applications described above, this aspect can be particularly suitable for ferroelectric random access memory applications.

Figure 5A:
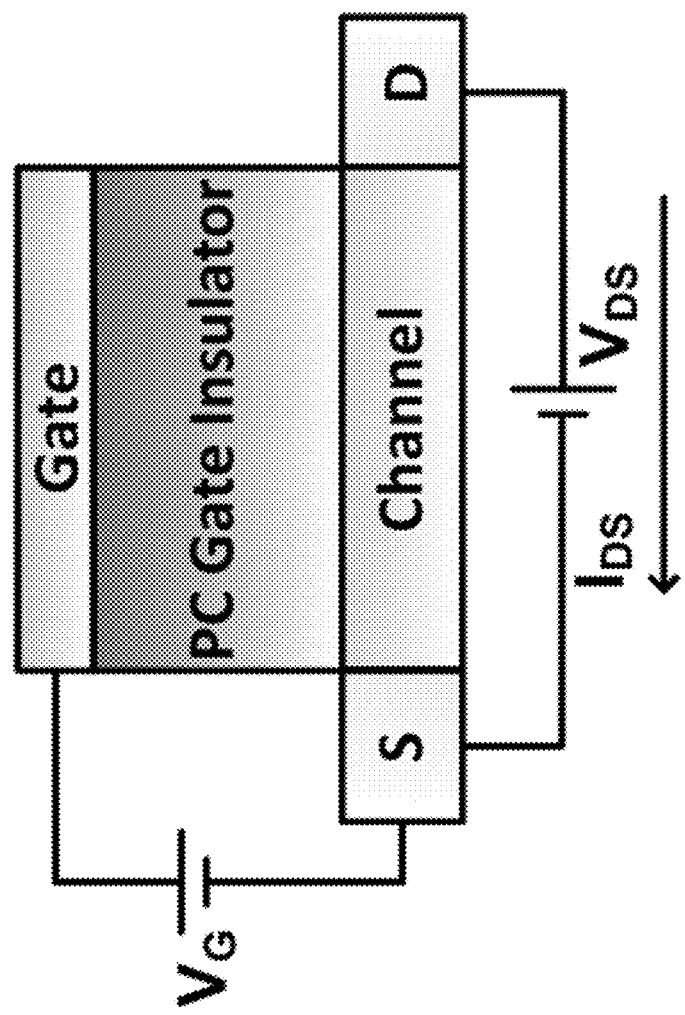
FIG. 5A is a schematic diagram of a classical FET having a positive capacitance (PC) gate insulator.
Figure 5B:
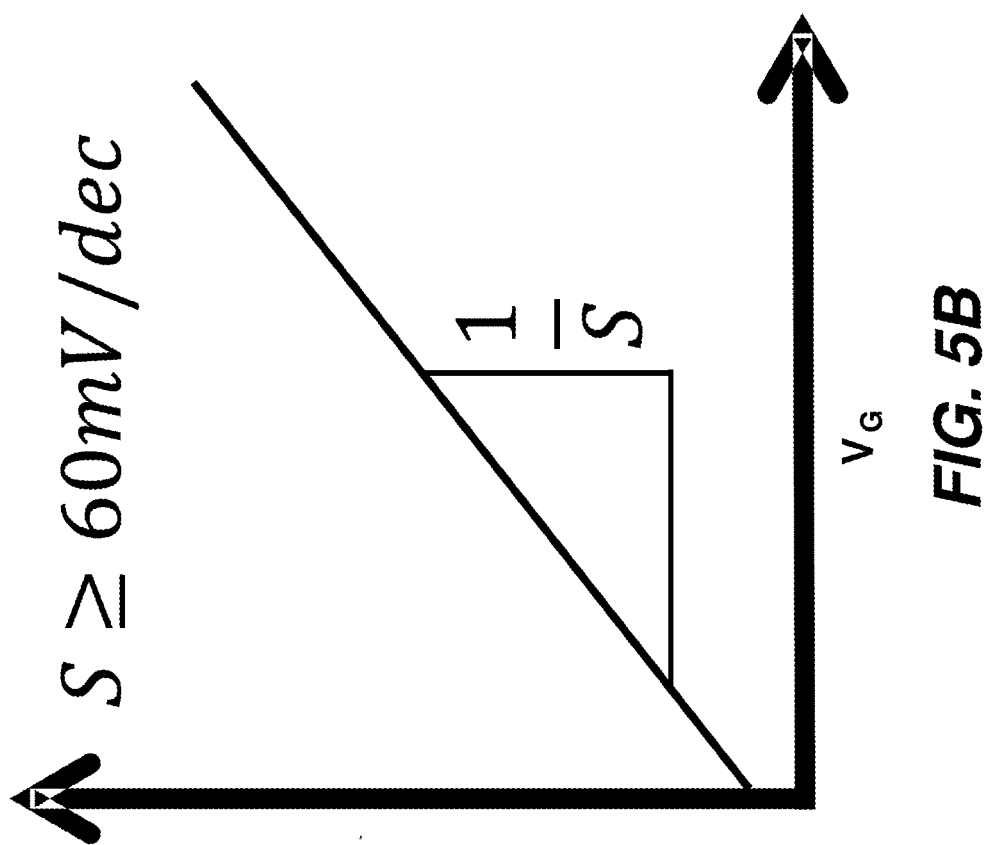
FIG. 5B is a plot illustrating the switching characteristics of the FET of FIG. 5A.

A field-effect transistor (FET), such as that shown in FIG. 5A, is a transistor that uses an electric field to control the shape and hence the conductivity of a channel of one type of charge carrier in a semiconductor material. Generally, a FET consists of an active channel through which charge carriers, electrons or holes, flow from the source to the drain (see FIG. 5A). Source and drain terminal conductors are connected to the semiconductor through ohmic contacts. The conductivity of the channel is a function of the potential applied across the gate and source terminals. The FET's three terminals are a source through which the carriers enter the channel; a drain through which the carriers leave the channel; and a gate, which is the terminal that modulates the channel conductivity. Most FETs are made with conventional bulk semiconductor processing techniques, using a single crystal semiconductor wafer as the active region, or channel.

Figure 5C:
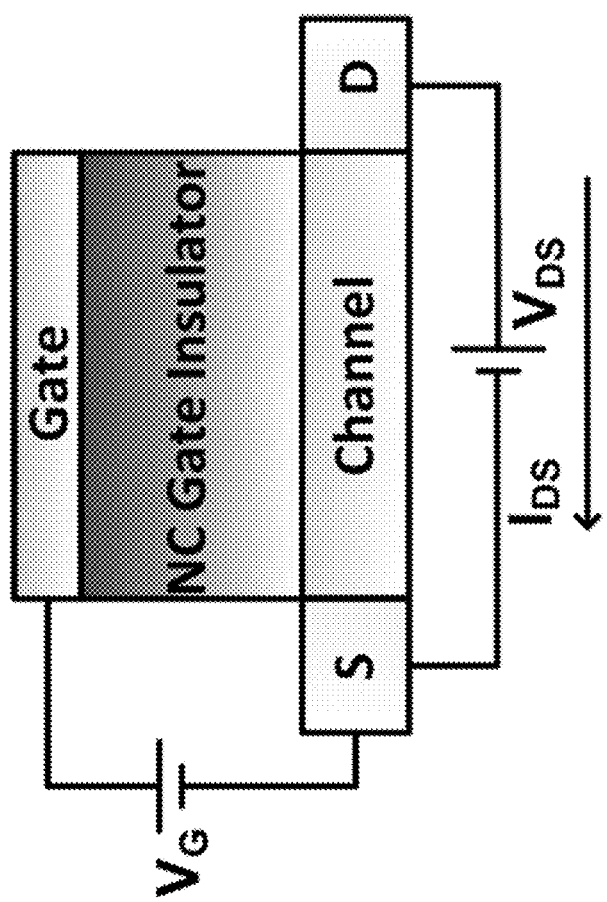
FIG. 5C is a schematic diagram of a FET having a negative capacitance (PC) gate insulator.
Figure 5D:
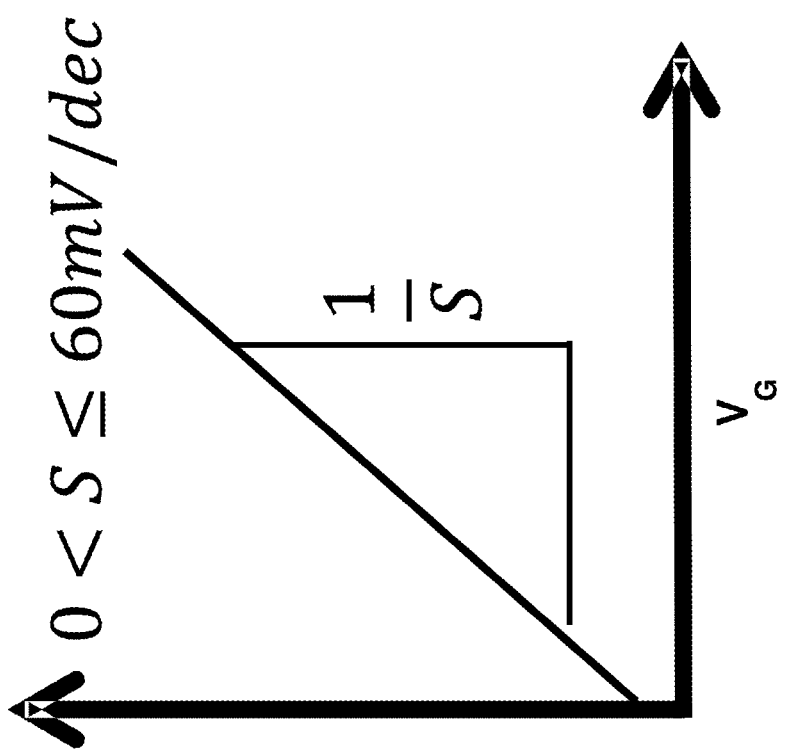
FIG. 5D is a plot illustrating the switching characteristics of the FET of FIG. 5C

According to one embodiment, as shown in FIG. 5C, at least two different negative capacitance gate insulators 530 and 532 are placed between the channel 534 and the gate 536 of a FET 510 having a source 538 and drain 540. Either of these NC gate insulators 530 and 532 may be formed from the same kind of materials described above for the first aspect. In a further embodiment, as shown in FIG. 7C, a first NC gate insulator 720 is composed of a ferroelectric material and is located adjacent to the channel 712. Overlying the first NC gate insulator 720 is an air-gap 724, which serves as a second NC gate insulator, and a gate 710. This design forms a movable-gate FET 708.

Series Combination of NC Gate Insulators:

Sub-threshold swing (S) is defined as the change in gate voltage ($V_G$) required for one order change in the drain current ($I_{DS}$). When a FET is operated between the gate voltages $V_{G1} < V_G < V_{G2}$, S is given by:

$$S \equiv \frac{\Delta V_G}{\log_{10}\left(\frac{I_{DS2}}{I_{DS1}}\right)} = \frac{\Delta V_G}{\Delta \psi_s} \frac{\Delta \psi_s}{\log_{10}\left(\frac{I_{DS2}}{I_{DS1}}\right)} = m \times n, \quad (12)$$

where $I_{DS1}$ and $I_{DS2}$ are the drain currents at $V_{G1}$ and $V_{G2}$, respectively. $\Delta \psi_s$ is change in the surface potential and $\Delta V_G = V_{G2} - V_{G1}$. The transport factor $$n = \frac{\Delta \psi_s}{\log_{10}\left(\frac{I_{DS2}}{I_{DS1}}\right)}$$

is 60 mV/decade at room temperature for above the barrier transport. On the other hand, the body factor m can be written as follows:

$$m \equiv \frac{\Delta V_G}{\Delta \psi_s} = \frac{\int_{Q_1}^{Q_2}(C_s(Q)^{-1} + C_{ins}(Q)^{-1})dQ}{\int_{Q_1}^{Q_2} C_s(Q)^{-1} dQ}. \quad (13)$$

Figure 6B:
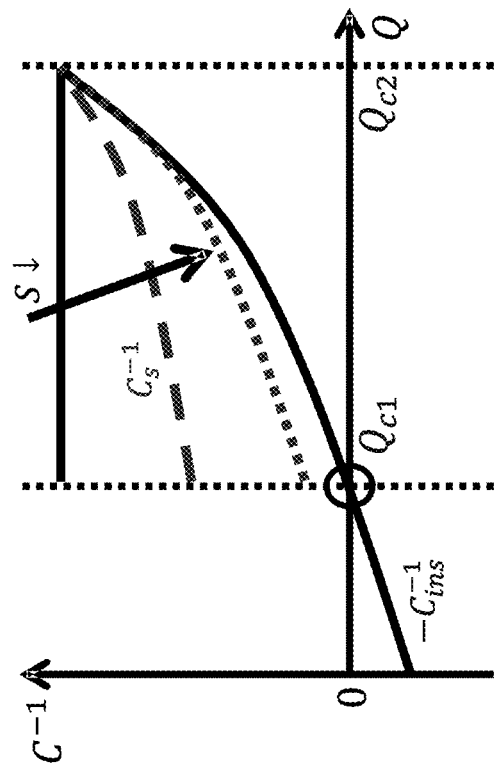
FIG. 6B is a plot illustrating capacitance-charge a relationship for the FET of FIG. 6A.
Figure 6A:
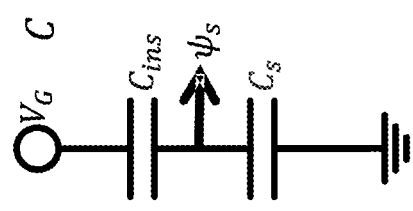
FIG. 6A is a schematic diagram of a capacitative divider model of a FET with a single NC gate insulator.

Here, $C_s(Q)$ is the channel capacitance and $C_{ins}(Q)$ is the capacitance of the gate insulator (a capacitive divider model of a FET is shown in FIG. 6A), Q is the gate charge, and $Q_1$, $Q_2$ correspond to $V_{G1}$, $V_{G2}$, respectively. For a classical-FET with positive capacitance gate insulator (i.e., $C_{ins}(Q) > 0$) such as $SiO_2$, Eq. 13 suggests that m>1, which limits the minimum value of S to be only 60 mV/decade (Eq. 12).

In a negative capacitance FET, NC gate insulator exhibits $C_{ins}(Q) < 0$ with $C_s(Q) > 0$ (as shown in FIG. 6B), making m less than one and <60 mV/decade. Note that, both ferroelectric in FE-FET and air-gap in SG-FET show negative capacitance behavior in a certain regime of operation. The NC regime in an NC-FET is defined by the charges $Q_{c1}$ and $Q_{c2}$. The charge $Q_{c1}$ separates the positive capacitance regime from the negative capacitance regime such that $C_{ins}(Q_{c1}) = \infty$; whereas $Q_{c2}$ is governed by physical constraints associated with a specific physical system (FIG. 6B). The overall gate capacitance $C_G^{-1} = C_s(Q)^{-1} + C_{ins}(Q)^{-1}$ should be positive for stable hysteresis-free operation. This stability requirement in turn puts a fundamental constraint on the value of $C_s(Q)$ i.e., $$C_s(Q)^{-1} \geq -C_{ins}(Q)^{-1}. \quad (14)$$

Equations 12-14 therefore suggest that the value of S depends on the matching between $C_s(Q)$ and $C_{ins}(Q)$. As shown in FIG. 6B, close matching between the two, decreases S. One can therefore expect that an obvious choice of $C_s(Q) = -C_{ins}(Q)$ should make S=0 mV/decade. However, S cannot be lowered all the way to 0 mV/decade because no choice of $C_s(Q)$ can match $-C_{ins}(Q)$ completely. Even if $C_s(Q)$ and $-C_{ins}(Q)$ are matched at almost all values of Q, they can't be matched at $Q=Q_{c1}$ due to the fact that $C_{ins}(Q_{c1}) = \infty$ (open circle in FIG. 6B at $Q=Q_{c1}$). Therefore, a single NC gate insulator can never exhibit 0 mV/decade switching characteristics. Moreover, using this matching argument, it has been previously established that for a given $C_{ins}(Q)$ (determined by the type of NC gate insulator) and $C_s(Q)$ (determined by the type of channel configuration), there is a fundamental lower limit of sub-threshold swing (60>$S_{min}$>0). For example, limit is 25 mV/decade for a SG bulk FET and 33 mV/decade for a SG-FET with constant channel capacitance (relevant for modern fully depleted FET architectures). On the other hand, the corresponding limits for FE-FET with SBT ($Sr_{0.8}Bi_{2.2}Ta_2O_9$) as the ferroelectric material are 52 mV/decade and 20 mV/decade, respectively. Considering this, there is an urgent need of an NC gate insulator that can eliminate the point of infinite capacitance and help realize ideal switching characteristics.

Figure 5E:
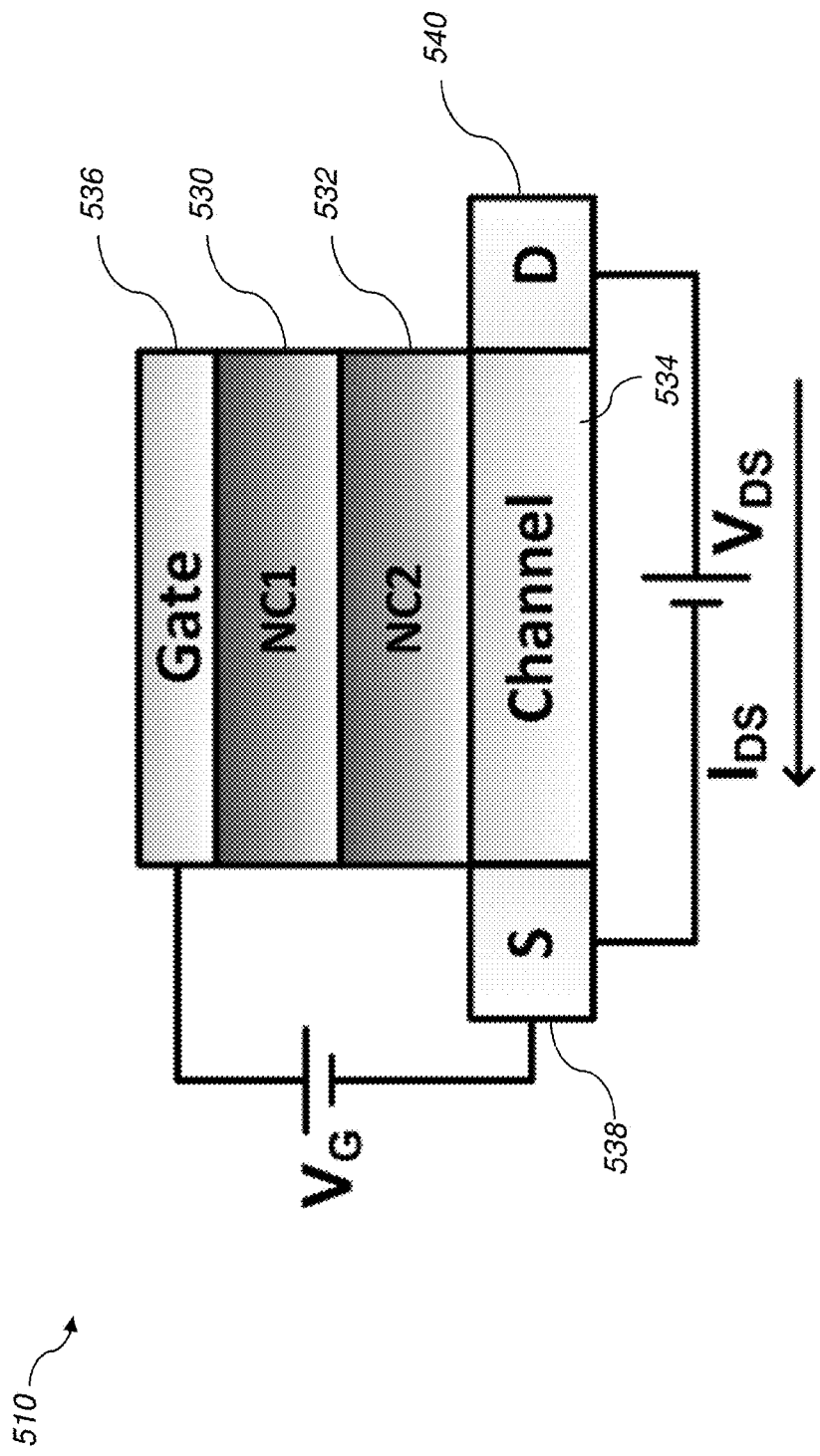
FIG. 5E is a schematic diagram of a FET having a having a gate insulator comprising a series combination of two types of negative capacitance gave insulators according to one embodiment.
Figure 5F:
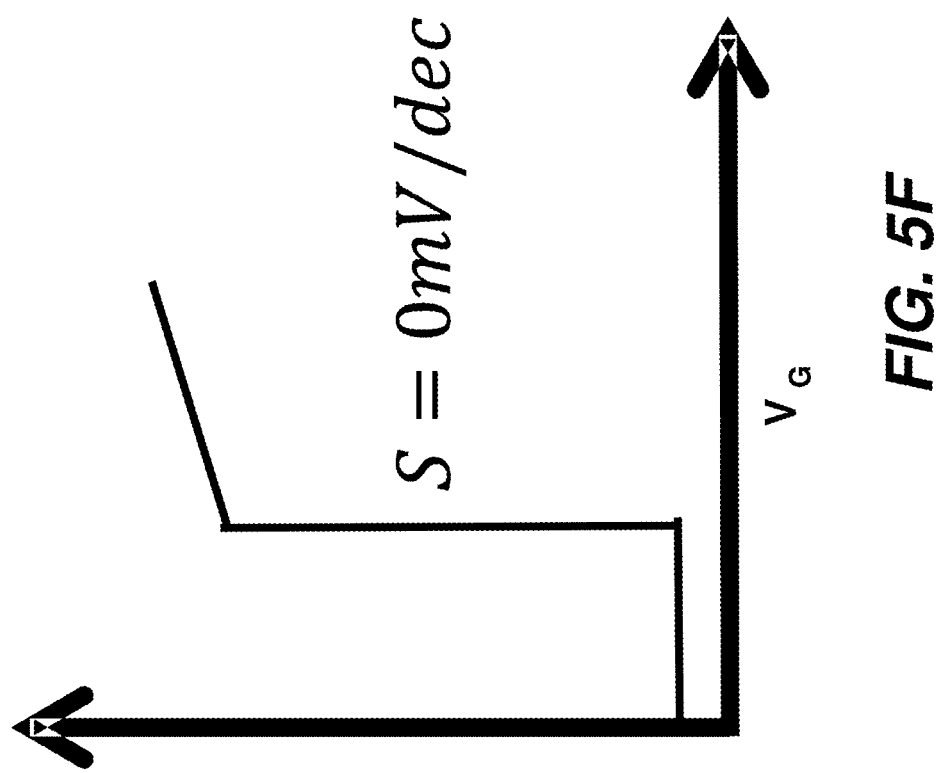
FIG. 5F is a plot illustrating the switching characteristics of the FET of FIG. 5E
Figure 6D:
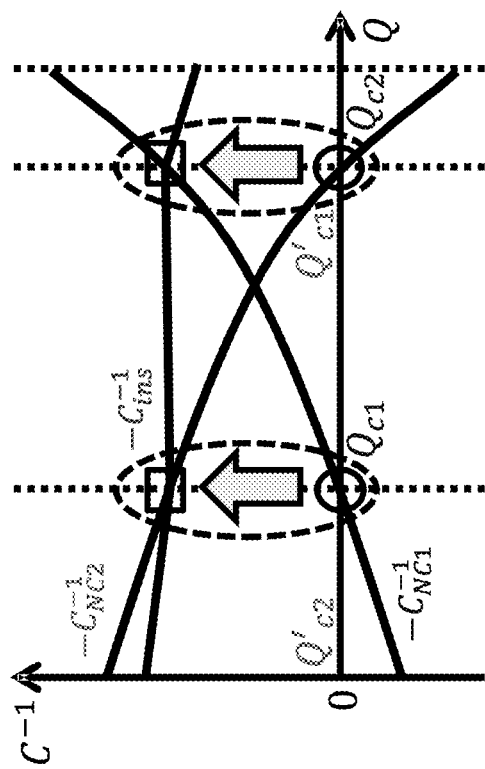
FIG. 6D is a plot illustrating capacitance-charge a relationship for the FET of FIG. 6C.
Figure 6C:
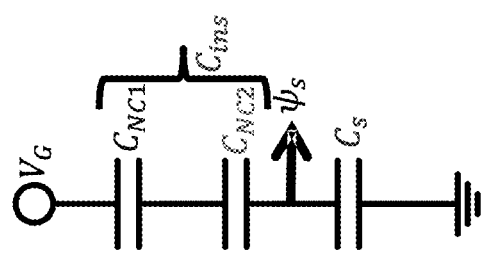
FIG. 6C is a schematic diagram of a capacitative divider model of a FET having a gate insulator comprising a series combination of two different types of gate insulators

In a series combination of two capacitors (say NC1 and NC2 in FIGS. 5E & 7C), if one of the capacitance is infinite, the total capacitance will be equal to the other finite capacitance i.e., $$C_{ins}^{-1} = C_{NC1}^{-1} + C_{NC2}^{-1} = C_{NC1}^{-1},$$

provided $C_{NC2} = \infty$. This observation gives us the key insight that the point of infinite capacitance (characteristic of a single NC) can be bypassed by putting it in series with other NC so that the total capacitance remains negative. NC gate insulators have to be carefully chosen such that (i) when one of the capacitance is infinite, other is negative i.e., $C_{NC1} = \infty$ with $C_{NC2} < 0$ or vice versa (see open circles, squares, arrows and oval in FIG. 6D at $Q=Q_{c1}$ and $Q=Q'_{c1}$) and (ii) total capacitance should remain negative in the regime where one of the capacitance is positive and other negative i.e., $C_{ins} < 0$ with $C_{NC1} < 0$ and $C_{NC2} > 0$ or vice versa (see region with $Q < Q_{c1}$ and $Q > Q'_{c1}$ in FIG. 6D). Therefore, series combination of properly designed NC gate insulators can make $C_{ins}(Q)$ negative by bypassing the point of infinite capacitance of individual NCs (FIG. 2d). This negative $C_{ins}(Q)$ can then be matched by $C_s(Q)$ through a proper design of the channel leading to 0 mV/decade switching characteristics.

Figure 7A:
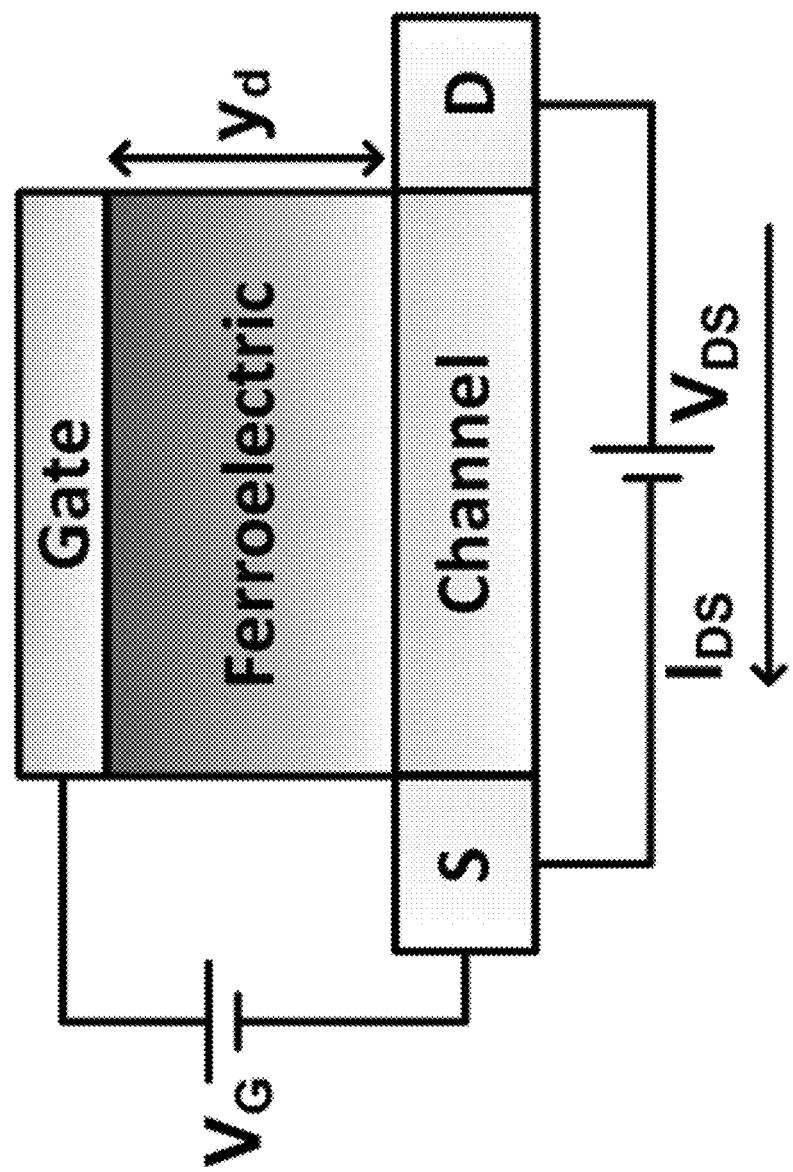
FIG. 7A is a schematic diagram of a FET with a single ferroelectric NC gate insulator.
Figure 7B:
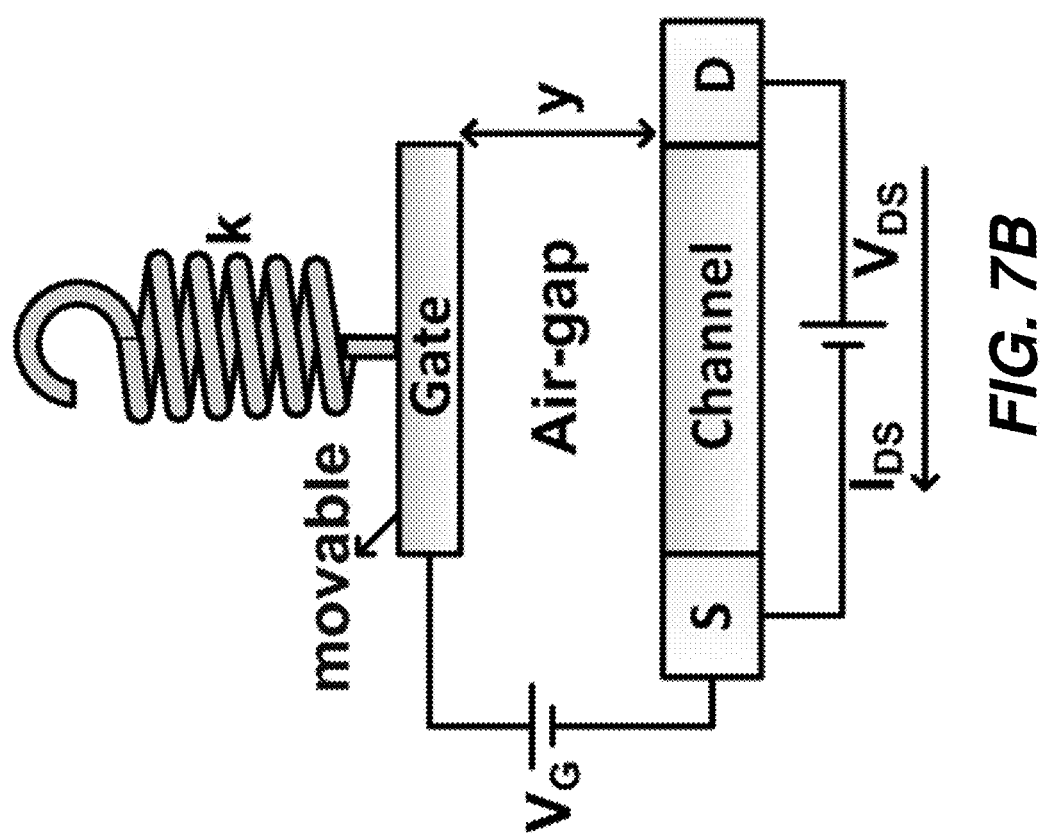
FIG. 7B is a schematic diagram of a suspended-gate (SG) FET with a single air-gap NC gate insulator.
Figure 7C:
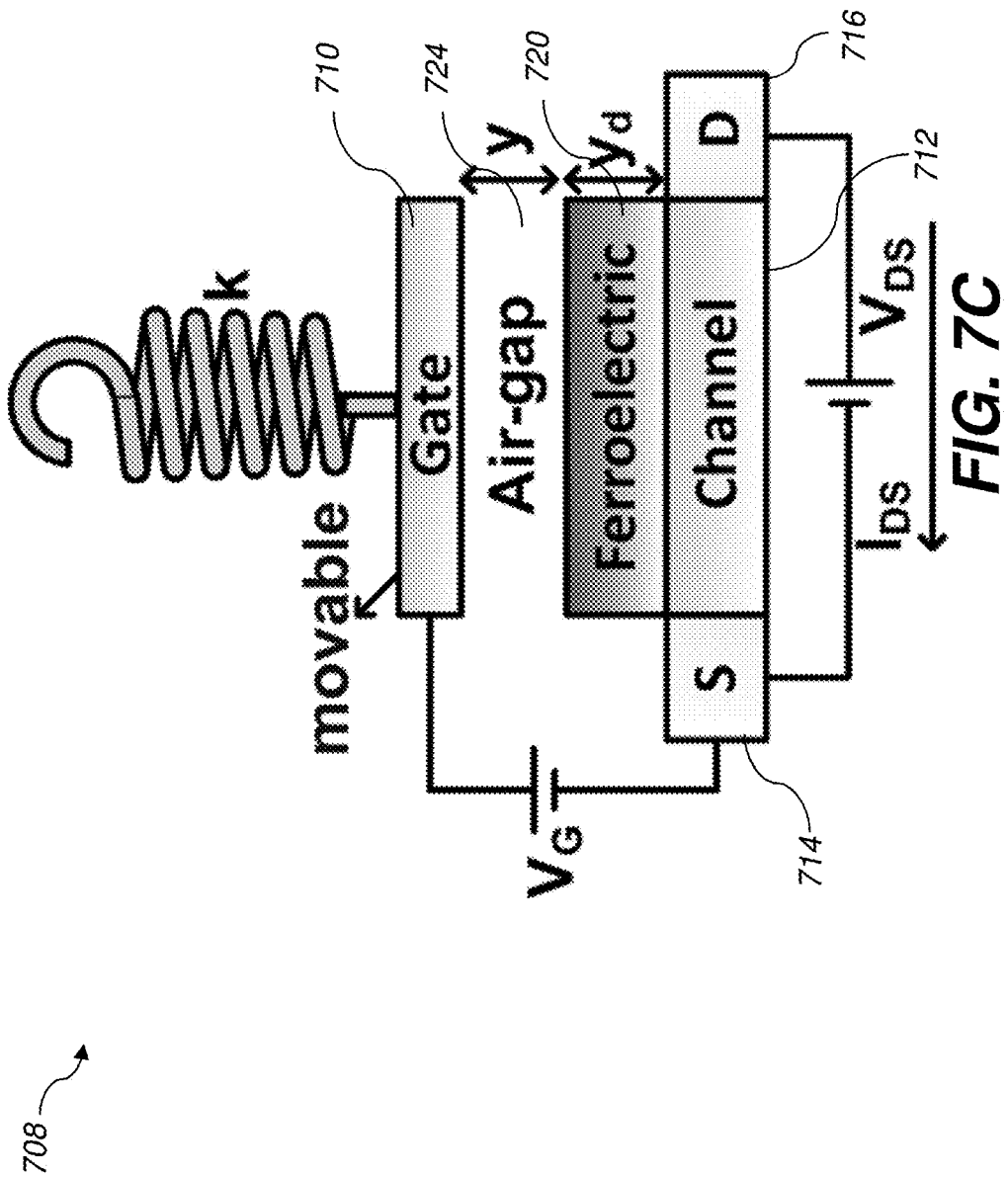
FIG. 7C is a schematic diagram of a FET with both a serially connected ferroelectric NC gate insulator and an air-gap NC gate insulator according to one embodiment.

Suspended-Gate Ferroelectric FET:

To illustrate the above concept, a series combination of ferroelectric of FE-FET (as shown in FIG. 7A) and air-gap capacitor of SG-FET (FIG. 7B) and in an SG-FE-FET (FIG. 7C) is provided. As shown in the embodiment of FIG. 7C, a series-combination SG-FE-FET 708 has a suspended gate 710, channel 712, source 714, drain 716, a first ferroelectric NC gate insulator 720 sits adjacent the channel 722. The air-gap 724 serves as the second NC gate insulator.

Figure 7D:
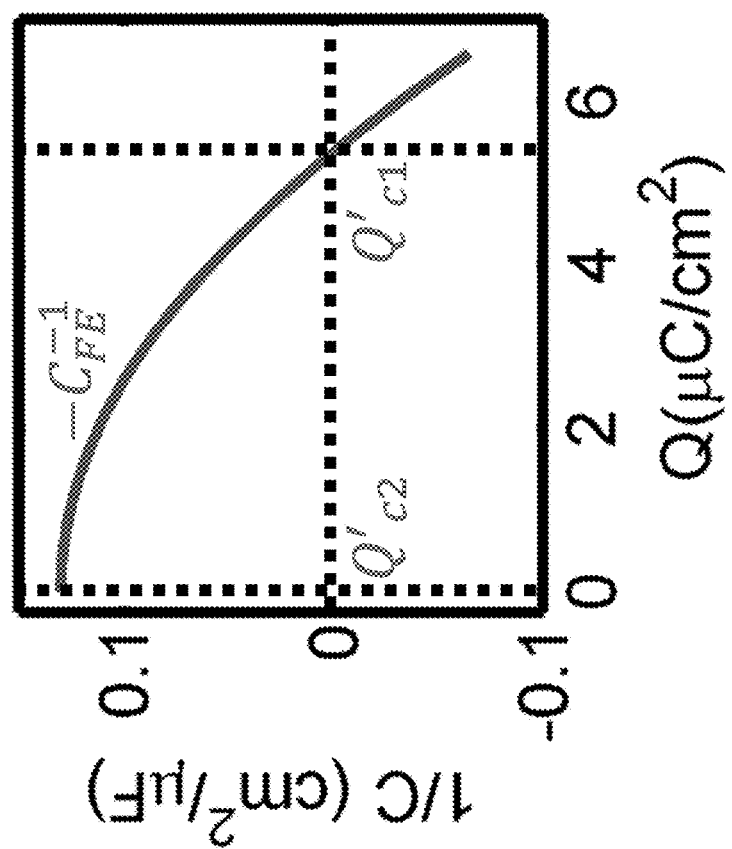
FIG. 7D is a plot illustrating negative capacitive characteristics of the ferroelectric FET of FIG. 7A.

For a ferroelectric, the capacitance ($C_{FE}$) is simply given by:

$$C_{FE}^{-1} = (\alpha_0 + 3\beta_0 Q^2) y_d, \quad (15)$$

where $\alpha_0$, $\beta_0$ are material constants and $y_d$ is the insulator thickness. FIG. 7D shows $C_{FE}^{-1}$ as a function of Q for a ferroelectric material with $\alpha_0 < 0$ & $\beta_0 > 0$, typical of a second order phase transition. Equation 15 implies that $$Q = Q'_{c1} = \sqrt{-\frac{\alpha_0}{3\beta_0}}$$

and $Q'_{c2}=0$ for an n-type FE-FET. Similarly, air-gap capacitance ($C_{air}$) in an SG-FET is given by:

$$C_{air}^{-1} = \frac{\alpha'_0 + 3\beta'_0 Q^2}{A}, \quad (16)$$

where $$\alpha'_0 = \frac{Ay_0}{\epsilon_0} > 0 \text{ and } \beta'_0 = -\frac{A^2}{2k\epsilon_0^2} < 0.$$

A is the area of gate electrode, k is the stiffness of gate, $y_0$ is the initial air-gap and $\epsilon_0$ is the permittivity of free space. Equation 16 and the physical boundary of y=0 (gate touching the dielectric) suggests that $$Q = Q_{c1} = \sqrt{-\frac{\alpha'_0}{3\beta'_0}} \text{ and } Q_{c2} = \sqrt{-\frac{\alpha'_0}{\beta'_0}}.$$

Figure 7E:
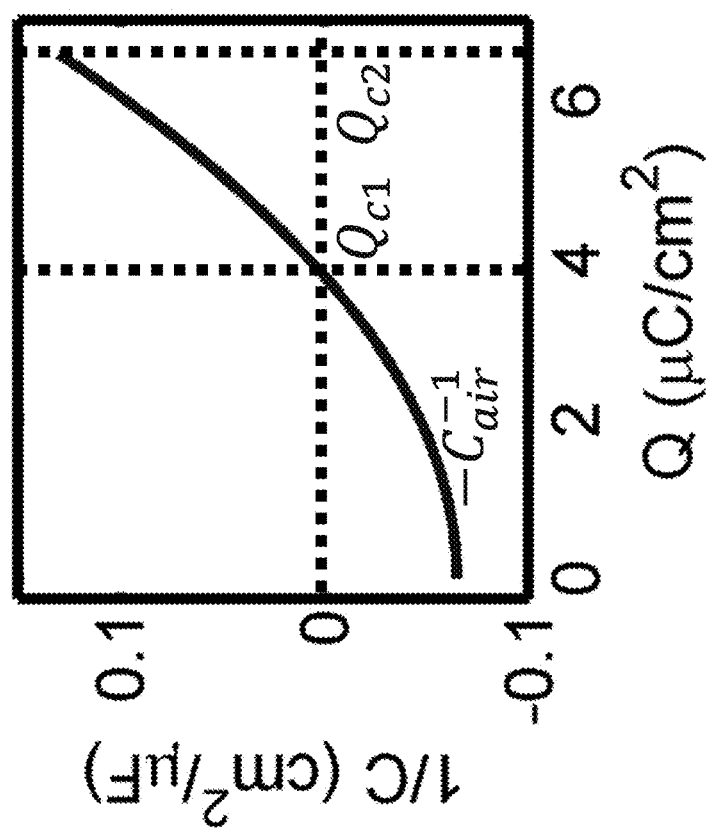
FIG. 7E is a plot illustrating negative capacitive characteristics of the suspended-gate FET of FIG. 7B.

Interestingly, the dependence of and $C_{air}^{-1}$ and $C_{FE}^{-1}$ are opposite to each other (FIGS. 7D & 7E). Now, the capacitance of the series combination can be obtained from Eqs. 15-16 as follows:

$$C_{ins}^{-1} = C_{FE}^{-1} + C_{air}^{-1}, \quad (17a)$$

$$C_{ins}^{-1} = \left(\alpha_0 y_d + \frac{\alpha'_0}{A}\right) + 3\left(\beta_0 y_d + \frac{\beta'_0}{A}\right)Q^2. \quad (17b)$$

Equation 17 suggests that the capacitance of the series combination ($C_{ins}$) can be tuned by tuning the parameters of the ferroelectric or suspended-gate. Note that, if the parameters are chosen such that $$\alpha_0 y_d + \frac{\alpha'_0}{A} < 0 \text{ and } \beta_0 y_d + \frac{\beta'_0}{A} < 0, C_{ins}$$

will be strictly negative from $Q=Q'_{c2}$ to $Q=Q_{c2}$. In such case, a variable channel capacitance such that $C_s=-C_{ins}$ would make the sub-threshold swing identically zero. Design of a channel with specific charge dependence however may not be easy. Therefore, a simpler design in which parameters are chosen such that $$\beta_0 y_d + \frac{\beta'_0}{A} = 0 \text{ and } \alpha_0 y_d + \frac{\alpha'_0}{A} < 0$$

may be used. These two conditions are equivalent to designing suspended-gate stiffness (k) and air-gap ($y_0$) as follows:

$$k = \frac{A}{2\epsilon_0^2 \beta_0 y_d}, \quad (18a)$$

$$y_0 < -\epsilon_0 \alpha_0 y_d. \quad (18b)$$

$C_{ins}$ in SG-FE-FET with k and $y_0$ following Eq. 18 reduces to a constant negative value i.e., $$C_{ins}^{-1} = \alpha_0 y_d + \frac{\alpha'_0}{A} < 0$$

Figure 7F:
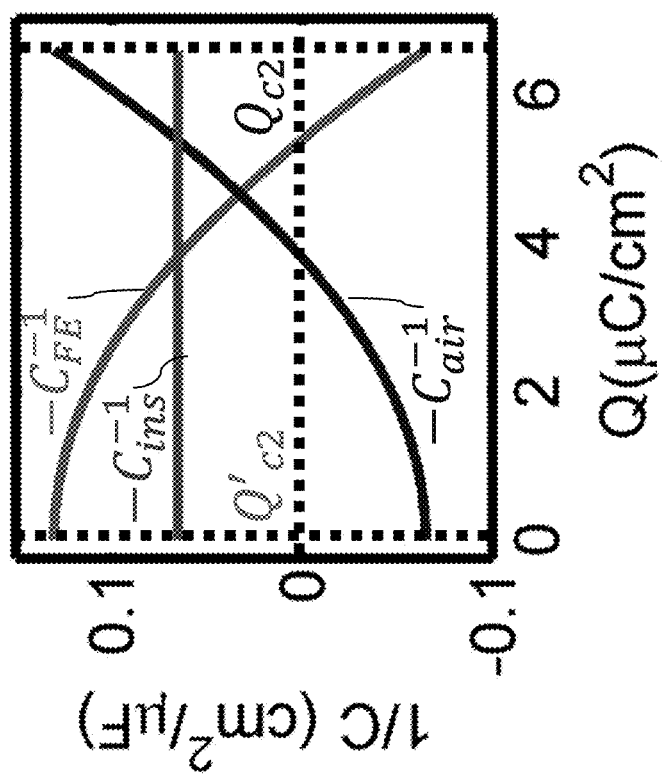
FIG. 7F is a plot illustrating negative capacitive characteristics of the series combination FET of FIG. 7C according to one embodiment.

(FIG. 7F). Now, a proper choice of the channel capacitance $$C_s^{-1} = -\left(\alpha_0 y_d + \frac{\alpha'_0}{A}\right), \quad (19)$$

will make the overall gate capacitance ($C_G^{-1}=C_{ins}^{-1}+C_s^{-1}=0$) infinity and S to be 0 mV/decade. The example case of constant channel capacitance is directly relevant for modern fully depleted FET architectures. It should be noted that this S=0 mV/decade is not a point sub-threshold swing as exhibited by NEMS relays or SG-FETs, but is extended from gate charge $Q=Q'_{c2}$ to $Q=Q_{c2}$.

In the previous section, it was shown that the gate insulator capacitance in a properly designed SG-FE-FET according to one embodiment may be constant and negative, thus giving rise to 0 mV/decade switching behavior in a constant channel capacitance FET. We now discuss both the steady state and dynamic response of SG-FE-FET using its two dimensional energy landscape as follows:

Two Dimensional Energy Landscapes of SG-FE-FET:

The static response of an SG-FE-FET can be understood by looking at the evolution of energy landscapes as a function of the applied gate voltage ($V_G$). The total energy (U) of an SG-FE-FET has four main components: (i) ferroelectric energy given by two-well Landau energy landscape of the ferroelectric i.e., $$U_{FE} = \left(\frac{1}{2}\alpha_0 Q^2 + \frac{1}{4}\beta_0 Q^4\right) Ay_d,$$

(ii) air-gap energy comprising of spring and electrostatic energy i.e., $$U_{air} = \frac{1}{2}k(y_0 - y)^2 + \frac{Q^2 Ay}{2\epsilon_0},$$

(iii) series capacitor energy $$U_s = \frac{Q^2 A}{2C_s},$$

(iv) energy due to the applied bias $$U_{V_G} = -QAV_G,$$

and is given by—

$$U = \left(\frac{1}{2}\alpha_0 Q^2 + \frac{1}{4}\beta_0 Q^4\right) Ay_d + \frac{1}{2}k(y_0 - y)^2 + \frac{Q^2 Ay}{2\epsilon_0} + \frac{Q^2 A}{2C_s} - QAV_G. \quad (20)$$

Note that, SG-FE-FET is stabilized at the minimum of total system energy (U) for a given $V_G$. On the energy landscape, points with $$\frac{\partial U_T}{\partial y} = 0 \text{ and } \frac{\partial U_T}{\partial Q} = 0$$

correspond to equilibrium and are given by the solutions of following equations:

$$k(y_0 - y) = \frac{Q^2 A}{2\epsilon_0}, \quad (21a)$$

$$A V_G = \left(\alpha_0 y_d + \frac{y}{\epsilon_0} + \frac{1}{C_s}\right) A Q + \beta_0 A y_d Q^3. \quad (21b)$$

Equation 21a describes the balance of spring and electrostatic forces acting on the suspended-gate; whereas Eq. 21b is Kirchhoff's voltage law applied to the series combination of three capacitors namely air-gap, ferroelectric and channel.

Figure 8A:
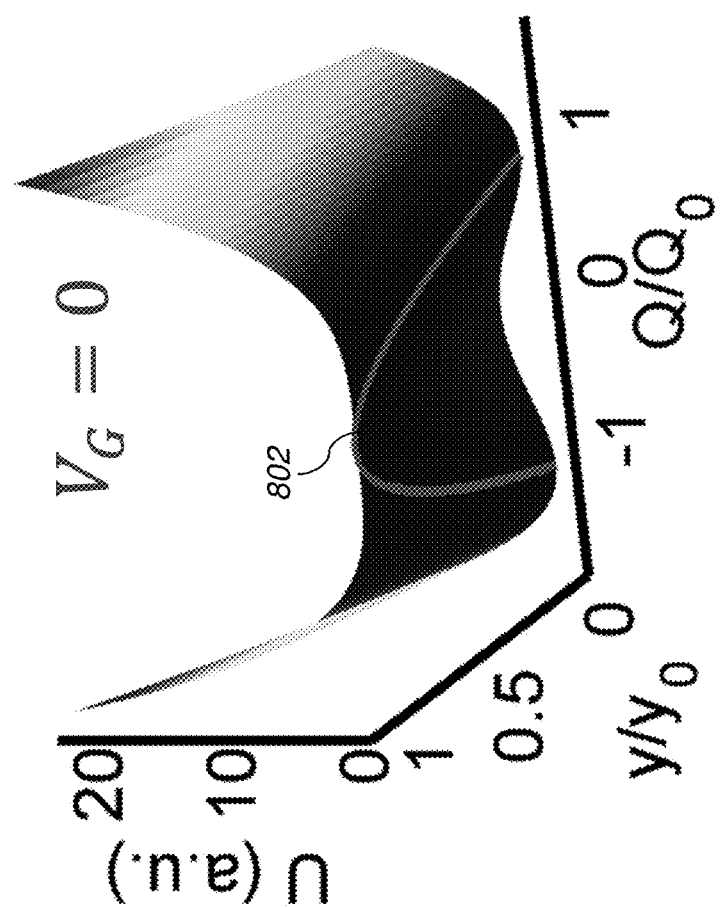
FIG. 8A shows a two-dimensional energy landscape diagram for a FET with a series combination of NC gate electrodes at $V_G=0$.

FIG. 8A shows the energy landscape as a function of y and Q at $V_G$=0 for parameters following Eq. 18. Curve 802 in FIG. 8A shows the points at which U is minimized. Interestingly, all the points on the curve 802 have the same energy. Note that, instead of discrete distinct points of stabilization, there is a connected path on the energy landscape and SG-FE-FET can be stabilized at any point on that path. This connected path is equivalent to the flat energy landscape for hysteresis-free 0 mV/decade switching as discussed in the reference. Also, equation of path is given by Eq. 21a. Note that, Eqs. 21a and 21b become identical for parameters following Eq. 18. So, the perfect matching of the gate insulator negative capacitor with channel capacitance is equivalent to having a connected path on the energy landscape.

Figure 8B:
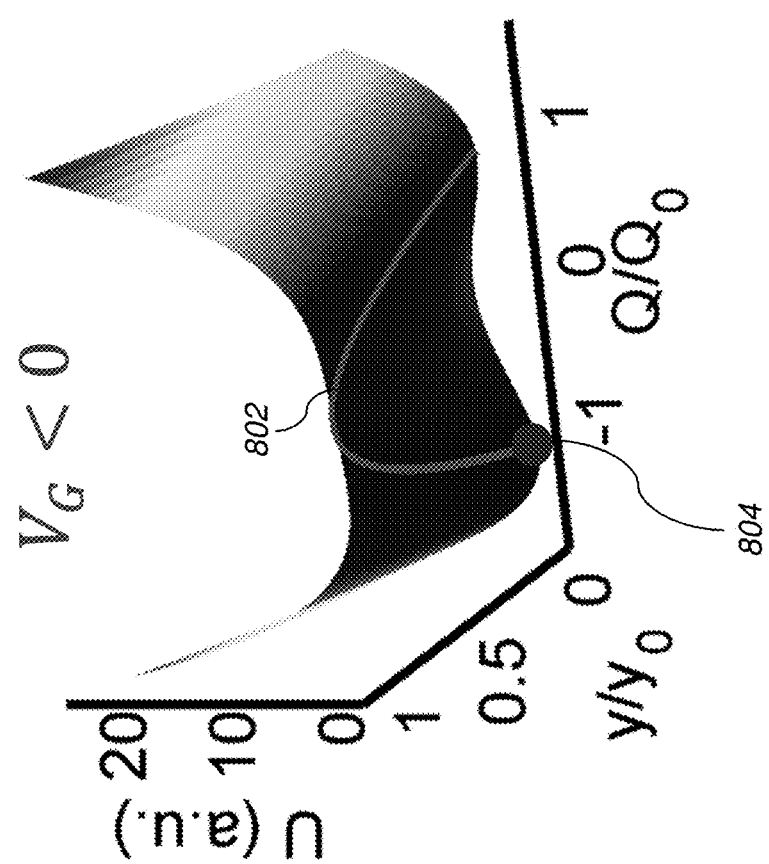
FIG. 8B shows a two-dimensional energy landscape diagram for a FET with a series combination of NC gate electrodes at $V_G<0$.
Figure 8C:
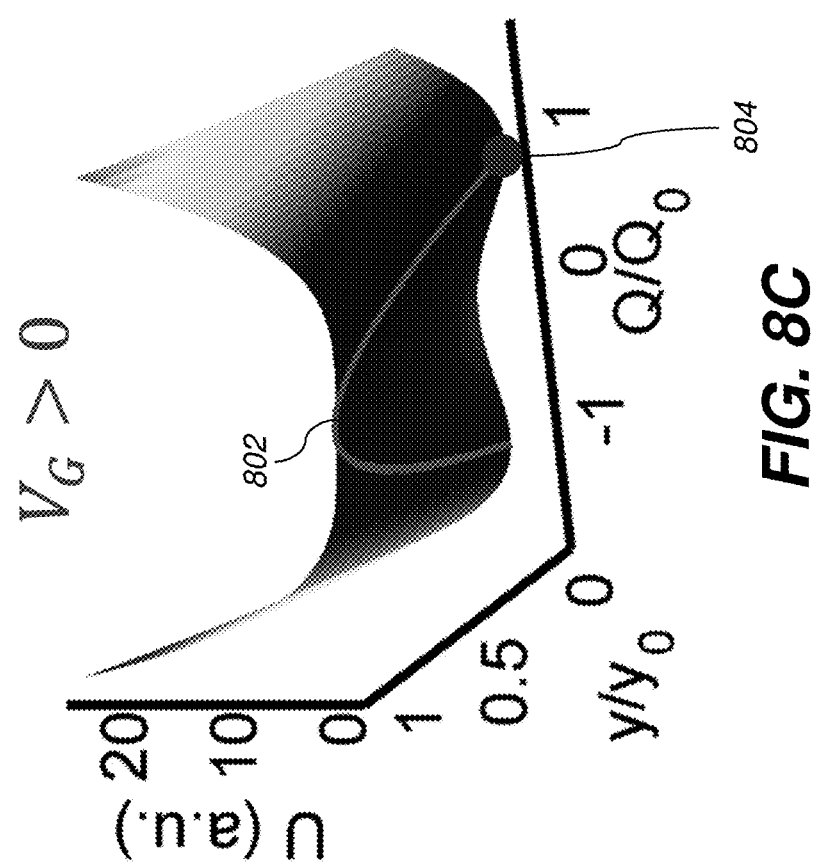
FIG. 8C shows a two-dimensional energy landscape diagram for a FET with a series combination of NC gate electrodes at $V_G>0$.
Figure 8D:
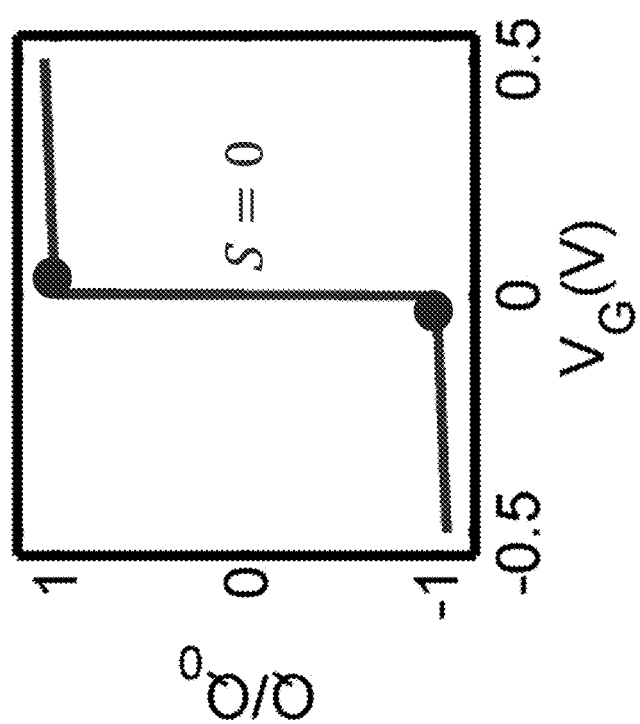
FIG. 8D is a plot showing the abrupt charge vs. voltage characteristics of the FET of FIG. 8A.

If $V_G$ is increased or decreased, energy landscapes tilts resulting in only one point of stable equilibria shown by a solid circle 804 in FIGS. 8B and 8C. Curved path 802 in FIGS. 8B and 8C denotes the force balance direction. Therefore, slight change of gate voltage from negative to positive, switches SG-FE-FET abruptly from a negative charge state (Q≈-$Q_0$) to a positive charge state (Q≈$Q_0$) (FIG. 8D). Note that, although the charge switches, gate remains stuck at y=0. In order to understand the role of the gate in 0 mV/decade switching, one needs to look at the switching dynamics which we discuss next.

Switching Dynamics:

When the gate voltage is switched from negative to positive, state of SG-FE-FET changes from y=0, Q≈-$Q_0$ (FIG. 8B) to y=0, Q≈$Q_0$ (FIG. 8C). The dynamics of this abrupt switching can be modeled by coupling gate dynamics with ferroelectric dynamics. The coupled equations are given as follows:

$$m\frac{dv}{dt} + bv = k(y_0 - y) - \frac{Q^2 A}{2\epsilon_0}, \quad (22a)$$

$$\rho_0 \frac{dQ}{dt} = V_G - V_{air} - \psi_s - (\alpha_0 Q + \beta_0 Q^3) y_d, \quad (22b)$$

$$\psi_s = Q/C_s. \quad (22c)$$

Equation 22a is Newton's law applied to the movable gate. Here, m is the mass of the gate, v is velocity, t is time, b is the damping coefficient, $k(y_0-y)$ is the restoring spring force and $$\frac{Q^2 A}{2\epsilon_0}$$

is the electrostatic force. Equation 22b is Landau-Khalatnikov (LK) equation and describes the dynamics of ferroelectric switching. Here, $\rho_0$ is material dependent constants and is related to the dissipation in the ferroelectric. $V_{air}$=Qy/$\epsilon_0$ is the voltage drop across air-gap and $\psi_s$ (Eq. 22c) is the surface potential or voltage drop in the channel.

Figure 9A:
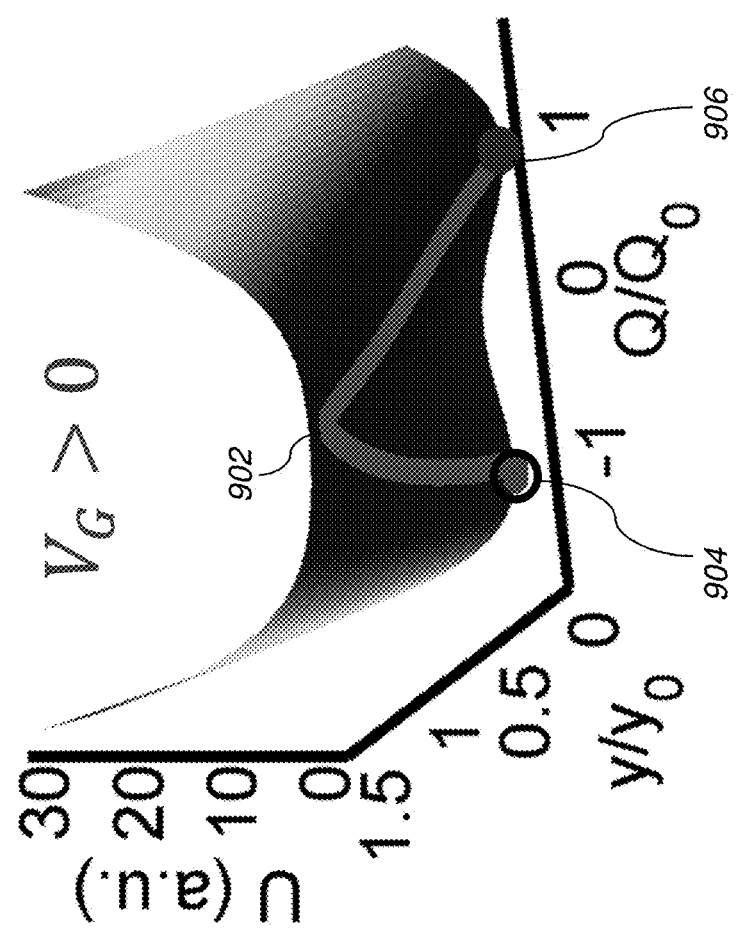
FIG. 9A shows the total energy landscape when the total energy landscape $V_G>0$ for a moveable-gate FET with a series combination of an air-gap and a ferroelectric NC gate insulator when the gate voltage is switched from negative to positive according to one embodiment.
Figure 9B:
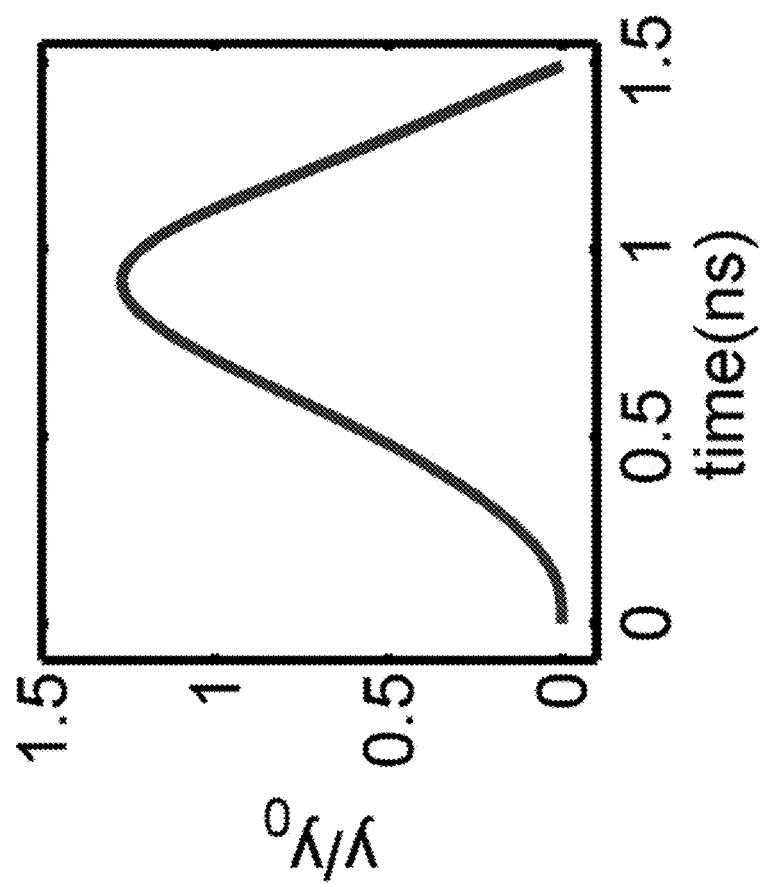
FIG. 9B is a plot showing the position of the movable gate of the FET of FIG. 9A as a function of time.
Figure 9C:
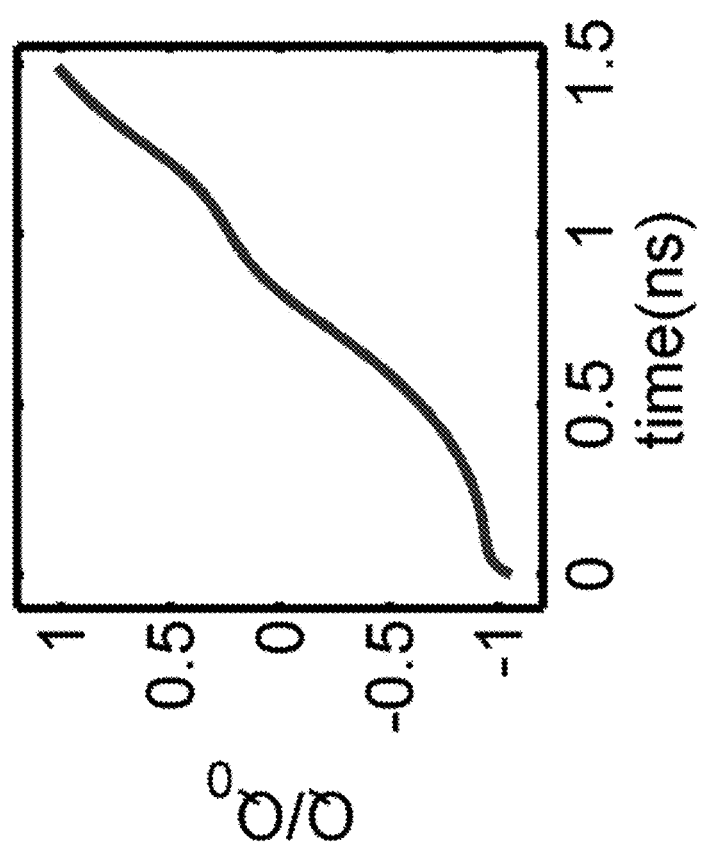
FIG. 9C is a plot showing the gate charge as a function of time for the FET of FIG. 9A.

Equations 22a-c are solved self-consistently to simulate the switching dynamics when $V_G$ changes from negative to positive. Before switching (i.e., $V_G$<0), SG-FE-FET is in the state y=0, Q≈-$Q_0$ (at t=0) (open circle 904 in FIG. 9A). Switching of SG-FE-FET occurs along the curve 902 shown in FIG. 9A. Solid circle 906 denotes the final state at $V_G$>0. Interestingly, with the change in $V_G$, first Q starts to change following Eq. 22b (FIG. 9C). Change in Q modifies the electrostatic force on the movable gate and causes it to move upward (FIG. 9B). Interestingly, during switching, the gate moves up and then comes back to stabilize at y=0. Note that, movement of the gate plays an intriguing role to facilitate ferroelectric switching. If the gate was fixed at y=0, ferroelectric and thus SG-FE-FET cannot switch due to the presence of an energy barrier (FIG. 9A). Coupling of the ferroelectric with movable gate creates a path in two dimensional energy landscape for hysteresis-free abrupt switching. Similar switching dynamics take place when gate voltage is switched from positive to negative voltage. Note that, the exact path followed on the energy landscape during switching depends on the value of m, b and $\rho_0$.

Based on the above, a switch is provided comprising two different types of negative capacitance gate insulators to achieve hysteresis-free 0 mV/decade switching. The disclosed switch reduces the power supply voltage and corresponding power dissipation of integrated circuits technology to the lowest possible value which is to be determined by noise considerations only. This switching behavior also illustrates that combining two bi-stable systems enables hysteresis-free abrupt switching. The switch may also be implemented in other two-well systems such as ferroelectric or magnetic random access memory (Fe-RAM or MRAM).

The invention has been described in detail with particular reference to certain preferred aspects thereof, but it will be understood that variations, combinations, and modifications can be affected by a person of ordinary skill in the art within the spirit and scope of the invention. This may include the combination of two or more elements where the individual elements have opposing energy landscapes which cancel each other and the combined structure has a much flatter energy landscape which allows reduced operational energy.

The invention claimed is:

1. A field effect transistor comprising:
   a. a source terminal;
   b. a drain terminal;
   c. a channel separating the source and drain terminals and through which charge carriers flow from the source terminal to the drain terminal, the channel comprising a semiconductor material;
   d. a gate electrode; and
   e. a gate insulator separating the gate electrode and the channel, the gate insulator comprising a series combination of at least two different negative capacitance (NC) materials, wherein a first one of the NC materials comprises an air gap and a second one of the NC materials comprises a ferroelectric material.

2. The transistor of claim 1, wherein the transistor is configured as a ferroelectric random access memory device.

3. The transistor of claim 1, wherein the transistor is configured as a magnetic random access memory device.

4. The transistor of claim 1, wherein the second one of the NC materials is adjacent to the channel.

5. The transistor of claim 4, wherein the first one of the NC materials is adjacent to the gate electrode.

6. The transistor of claim 5, wherein the gate electrode is arranged so that the gate electrode is attached to at least one point in a cantilevered fashion and spaced apart from the second one of the NC materials.

7. The transistor of claim 5, wherein the gate electrode is mounted to at least two points and spaced apart from the second one of the NC materials.

8. The transistor of claim 5, wherein the gate electrode comprises a suspended gate.

\* \* \* \* \*